(12) United States Patent
Wu et al.

(10) Patent No.: US 12,021,053 B2
(45) Date of Patent: Jun. 25, 2024

(54) SEMICONDUCTOR PACKAGE AND METHOD

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/832,949

(22) Filed: Jun. 6, 2022

(65) Prior Publication Data

US 2022/0302067 A1 Sep. 22, 2022

Related U.S. Application Data

(62) Division of application No. 17/020,130, filed on Sep. 14, 2020, now Pat. No. 11,355,463.

(60) Provisional application No. 63/027,639, filed on May 20, 2020.

(51) Int. Cl.
*H01L 23/00* (2006.01)

(52) U.S. Cl.
CPC ............ *H01L 24/20* (2013.01); *H01L 24/19* (2013.01); *H01L 2224/2101* (2013.01); *H01L 2224/211* (2013.01); *H01L 2224/214* (2013.01)

(58) Field of Classification Search
CPC . H01L 24/20; H01L 24/19; H01L 2224/2101; H01L 2224/211; H01L 2224/214
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |

(Continued)

FOREIGN PATENT DOCUMENTS

| EP | 3605603 A1 | 2/2020 |
| KR | 20210093712 A | 7/2021 |
| WO | 2019132965 A1 | 7/2019 |

*Primary Examiner* — Timor Karimy
(74) *Attorney, Agent, or Firm* — Slater Matsil, LLP

(57) ABSTRACT

In an embodiment, a structure includes a core substrate, a redistribution structure coupled, the redistribution structure including a plurality of redistribution layers, the plurality of redistribution layers comprising a dielectric layer and a metallization layer, a first local interconnect component embedded in a first redistribution layer of the plurality of redistribution layers, the first local interconnect component comprising conductive connectors, the conductive connectors being bonded to a metallization pattern of the first redistribution layer, the dielectric layer of the first redistribution layer encapsulating the first local interconnect component, a first integrated circuit die coupled to the redistribution structure, a second integrated circuit die coupled to the redistribution structure, an interconnect structure of the first local interconnect component electrically coupling the first integrated circuit die to the second integrated circuit die, and a set of conductive connectors coupled to a second side of the core substrate.

20 Claims, 24 Drawing Sheets

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2016/0329284 A1* | 11/2016 | We .................... H01L 24/25 |
| 2017/0062383 A1 | 3/2017 | Yee et al. |
| 2019/0123021 A1 | 4/2019 | Pan et al. |
| 2019/0319008 A1 | 10/2019 | Liao et al. |
| 2020/0043853 A1* | 2/2020 | Kim .................... H01L 24/81 |
| 2020/0105544 A1 | 4/2020 | Tsai et al. |
| 2020/0273839 A1 | 8/2020 | Elsherbini et al. |
| 2021/0225780 A1 | 7/2021 | Wu et al. |

* cited by examiner

SEMICONDUCTOR PACKAGE AND METHOD

PRIORITY CLAIM AND CROSS-REFERENCE

This application is a divisional of U.S. patent application Ser. No. 17/020,130, filed Sep. 14, 2020, entitled "Semiconductor Package and Method," which claims the benefit of U.S. Provisional Patent Application No. 63/027,639, filed May 20, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
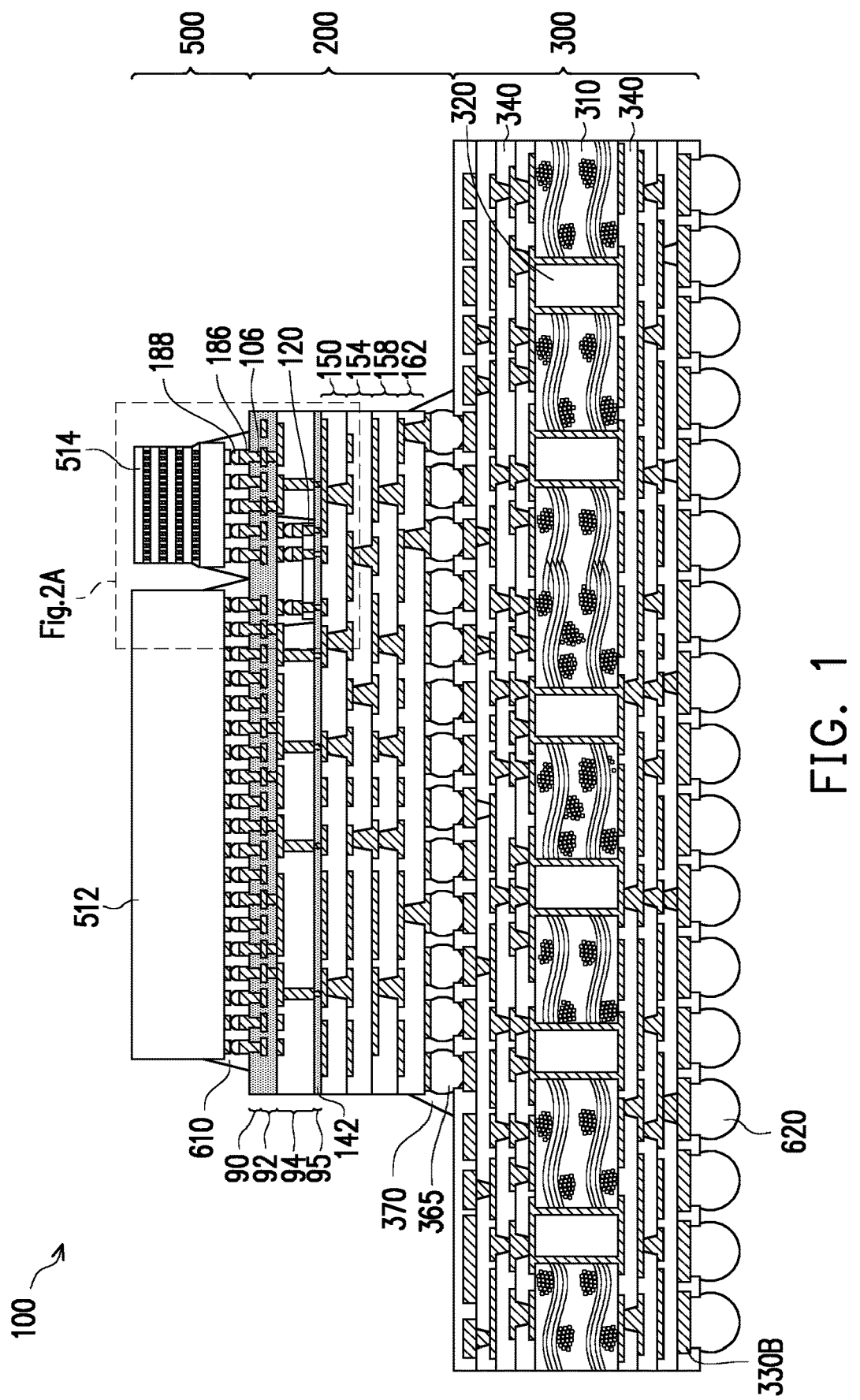
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package component is having one or more integrated circuit dies. In some embodiments, the package component is a system-on-integrated-substrate (SoIS) package. The package component includes a local interconnect component embedded in a redistribution structure. The embedded local interconnect component provides electrical connection between the integrated circuit dies. The embedded local interconnect component increases the communication bandwidth between the integrated circuit dies while maintaining low contact resistance and high reliability. In some embodiments, other components such as an integrated voltage regulator, an integrated passive device, a static random-access-memory, the like, or a combination thereof can also be embedded in a similar manner as the embedded local interconnect component. The embodiments disclosed herein may be applied to various systems such as high performance computing (HPC), edge computing, cloud computing, data centers, networking, and artificial intelligence.

The redistribution structure is connected to the integrated circuit dies and provides electrical connection between the integrated circuit dies and a core substrate and/or between the integrated circuit dies. The core substrate is additionally connected to a set of external conductive features. In such a manner, the integrated circuit dies are electrically connected to the core substrate, and ultimately to the external conductive features, through the core substrate and the redistribution structure.

In accordance with some embodiments, the redistribution structure, the embedded local interconnect component, the core substrate, and the integrated circuit dies, may be individually fabricated and tested prior to assembling the completed package component. This further increases component and board level reliability.

Due to the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

In accordance with some embodiments, conductive connectors used to connect the core substrate to the redistribution structures may take the form of, for example, a ball grid array (BGA). Integration of such conductive connectors may provide flexibility in placement for semiconductor devices, such as integrated passive device (IPD) chips, integrated voltage regulators (IVRs), active chips, among other electrical components, to implement system-on-a-chip type of package components, thus reducing fabrication complexity. Such embodiments may also provide a greater amount of flexibility for various other package configurations as well.

Figure 2A:
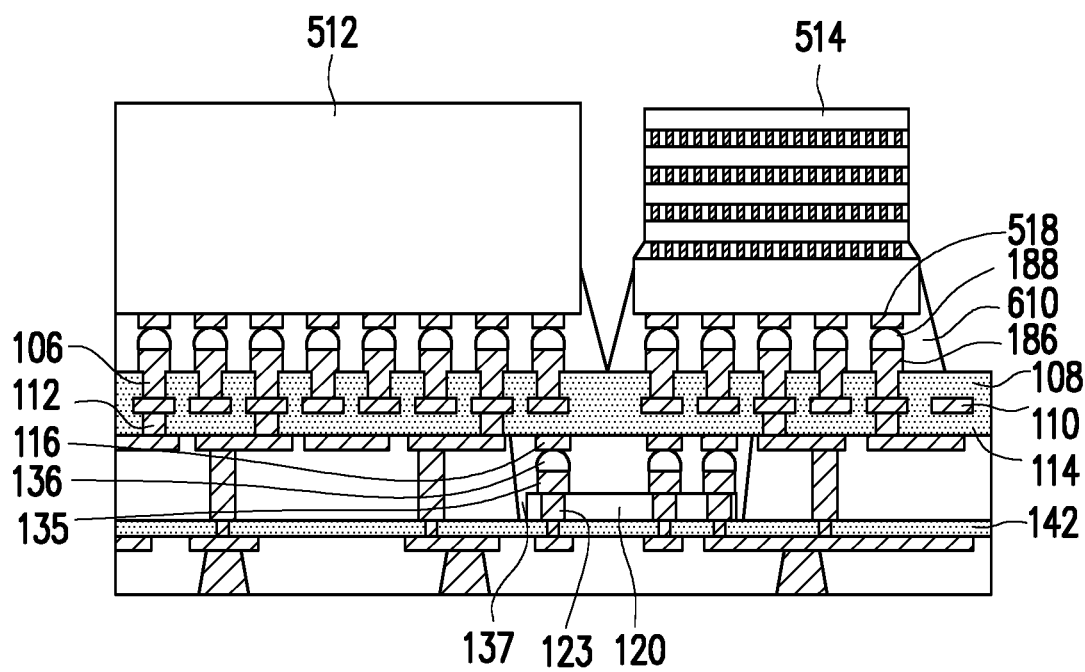
FIGS. 2A and 2B illustrate detailed views of a portion of the cross-sectional view of FIG. 1 in accordance with some embodiments.
Figure 2B:
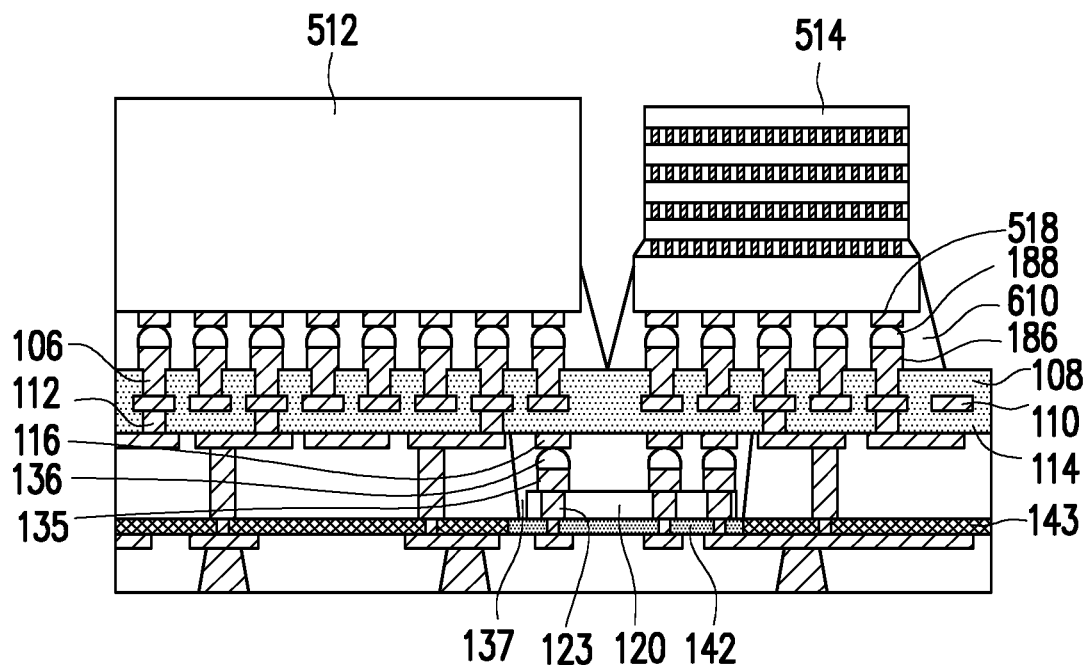

FIG. 1 illustrates a cross-sectional view of a singulated package component 100 in accordance with some embodiments. FIGS. 2A and 2B illustrate detailed views of a portion of the cross-sectional view of FIG. 1 in accordance with some embodiments. The singulated package component 100 includes a semiconductor device (e.g., an integrated circuit package 500), a redistribution structure 200 having one or more redistribution layers, a core substrate 300, and external connectors 620, among other elements. The integrated circuit package 500 may include one or more dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the semiconductor device may be an integrated circuit die.

The integrated circuit package 500 may include a plurality of integrated circuit dies. As shown, the integrated circuit package 500 includes one or more logic dies 512, one or more memory dies 514, and one or more input/output (I/O) dies 516 (not shown in FIG. 1, but see FIG. 3) for illustrative purposes. The integrated circuit dies may be formed in one or more wafers, which may include different device regions that are singulated in subsequent steps. The integrated circuit dies may be packaged with other similar or different integrated circuit dies using known manufacturing techniques. In some embodiments, the integrated circuit dies 512 and 514 are formed using similar processes and techniques as described below in reference to FIG. 7.

In some embodiments, one or more of the integrated circuit dies 512 and 514 may be stacked devices that include multiple semiconductor substrates. For example, the memory die 514 may be a memory device such as a hybrid memory cube (HMC) module, a high bandwidth memory (HBM) module, or the like that includes multiple memory dies. In such embodiments, the memory die 514 includes multiple semiconductor substrates interconnected by through-substrate vias (TSVs). Each of the semiconductor substrates may (or may not) have an interconnect structure.

The dies 512 and 514 have bond pads 518 that are bonded to the conductive connectors 188. In some embodiments, the bond pads 518 are made of a conductive material and may be similar to the conductive lines (see, e.g., conductive lines 110) described below.

Conductive connectors 188 provide electrical connection between the redistribution structure 200 and the integrated circuit package 500. An underfill 610 may be included to securely bond the integrated circuit package 500 to the redistribution structure 200 and provide structural support and environmental protection.

As discussed in greater detail below, the redistribution structure 200 provides electrical pathing and connection between the integrated circuit package 500 and a core substrate 300 by way of conductive connectors 365. In some embodiments, the redistribution structure 200 has one or more redistribution layers comprising metallization patterns, comprising, for example, conductive lines 110 and 116 and conductive vias 106 and 112, and dielectric layers 108 and 114 separating adjacent layers of the conductive lines 110 and 116.

As discussed in greater detail below, the redistribution structure 200 includes one or more local interconnect components 120. The local interconnect components 120 provide electrical routing and connection between the integrated circuit dies 512 and 514 of the integrated circuit package 500 and may be referred to as interconnecting dies 120. The local interconnect components 120 increase the communication bandwidth between the integrated circuit dies 512 and 514 while maintaining low contact resistance and high reliability. As illustrated in FIGS. 1 and 2A-2B, the local interconnect components 120 are connected to metallization patterns 116 of the redistribution structure 200 by conductive connectors 136. In some embodiments, the conductive connectors 136 are solder connectors 136. The local interconnect components 120 are embedded within the redistribution structure 200 and an underfill 137 is formed surrounding the conductive connectors 136 and between the local interconnect components 120 and the dielectric layer 114. In some embodiments, the local interconnect components 120 may include through substrate vias 123 that extend through the local interconnect components 120 to be connector to metallization patterns adjacent backsides of the local interconnect components 120.

Due to the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

In the embodiment of FIG. 2A, a dielectric layer 142 extends across the singulated package component 100, whereas in FIG. 2B, the dielectric layer 142 is only on the local interconnect component 120. Further, in FIG. 2B, a dielectric layer 143 is laterally surrounding the dielectric layer 142. The details of the dielectric layers 142 and 143 will be discussed below with respect to FIGS. 11A and 11B.

The redistribution structure 200 may be electrically and mechanically attached to the core substrate 300. The core substrate 300 may include a central core 310, with conductive vias 320 extending through the central core 310, and additional optional redistribution structures 340 along opposing sides of the central core 310. Generally, the core substrate 300 provides structural support for the package component 100, as well as providing electrical signal routing between the integrated circuit package 500 and the external connectors 620.

Figure 3:
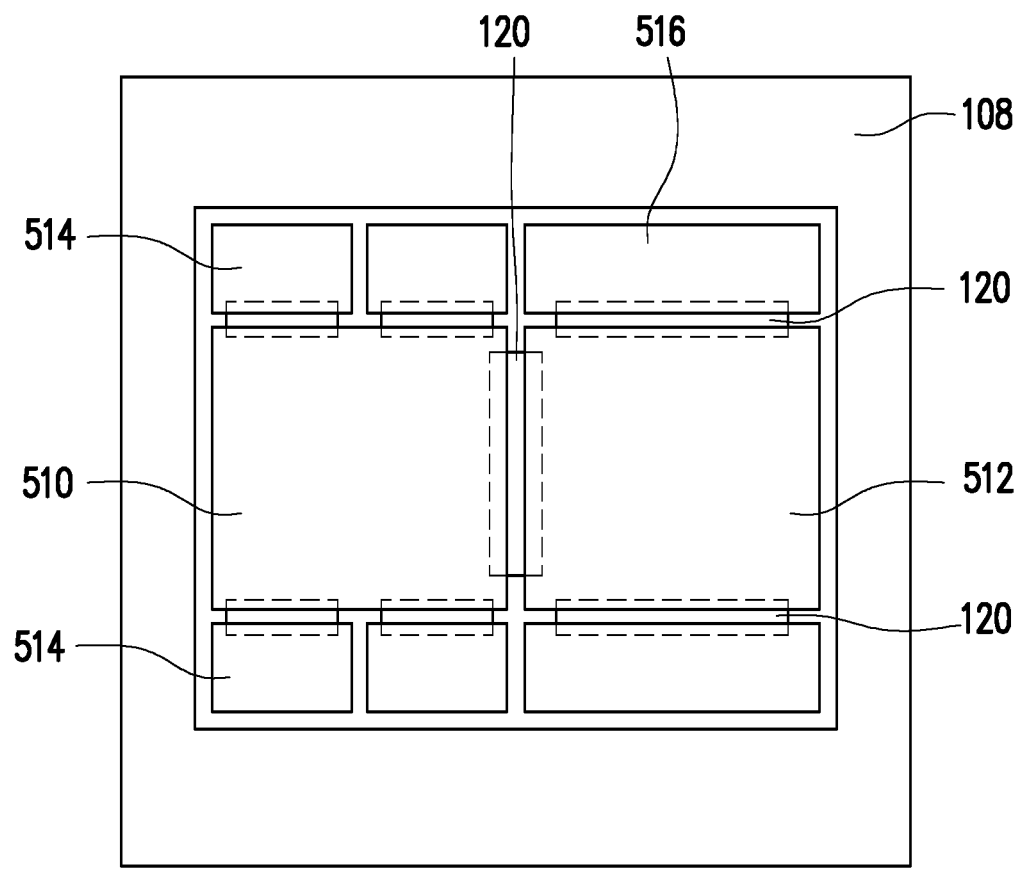
FIG. 3 illustrates a plan view of the package component in accordance with some embodiments.

FIG. 3 illustrates a plan view of the package component in accordance with some embodiments. The embodiment illustrated in FIG. 3 includes two logic dies 510 and 512, four memory dies 514, two I/O dies 516, and seven local interconnect components 120. In this embodiment, each of the memory dies 514 and I/O dies 516 are connected to at least one of the logic dies 512 by a respective local interconnect component 120. In addition, the two logic dies are connected together by a local interconnect component 120. Other embodiments may include more or less logic dies 510 and 512, memory dies 514, I/O dies 516, and local interconnect components 120. In some embodiments, each of the integrated circuit dies are connected to each adjacent integrated circuit die by a local interconnect component.

FIGS. 4 through 16 illustrates various intermediate stages in fabricating a redistribution structure 200 (see FIG. 16), in accordance with some embodiments. A first package region 101A and a second package region 101B are illustrated where each package region is eventually singulated from other package regions. The illustrations of the individual features have been simplified in FIGS. 4 through 16 for ease of illustration.

Figure 4:
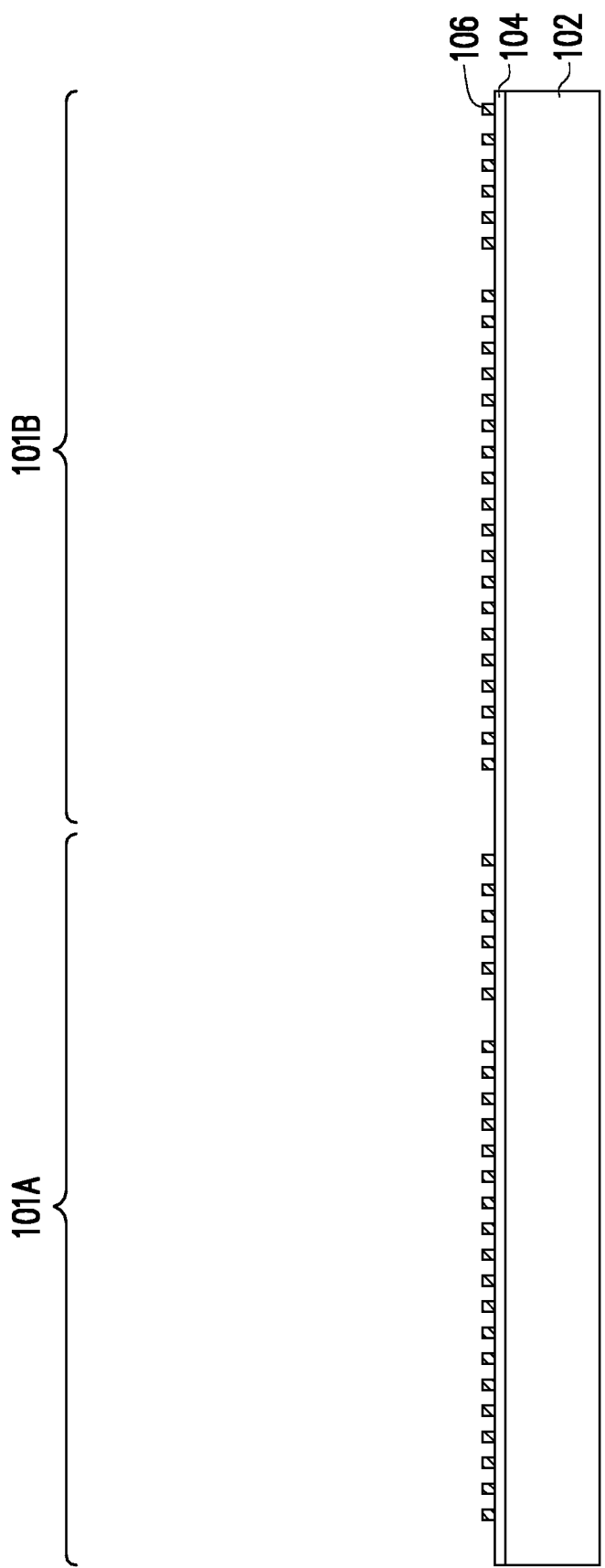
FIGS. 4 through 16 and 19 through 23 illustrate cross-sectional views of intermediate steps during a process for forming a package component in accordance with some embodiments.

Referring first to FIG. 4, a carrier substrate 102 is provided, a release layer 104 is formed on the carrier substrate 102, and conductive vias 106 are formed over the release layer 104. The carrier substrate 102 may be a glass carrier substrate, a ceramic carrier substrate, or the like. The carrier substrate 102 may be a wafer, such that multiple redistribution structures can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and be substantially planar within process variations.

In FIG. 4, conductive vias 106 are formed on the release layer 104. The conductive vias 106 may subsequently be exposed by a carrier debonding process and used to provide connection the redistribution structure 200. Conductive vias 106 form the metallization pattern for redistribution layer 90. As an example to form the conductive vias 106, a seed layer (not shown) is formed over the release layer 104. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive vias 106. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive vias 106. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 5:
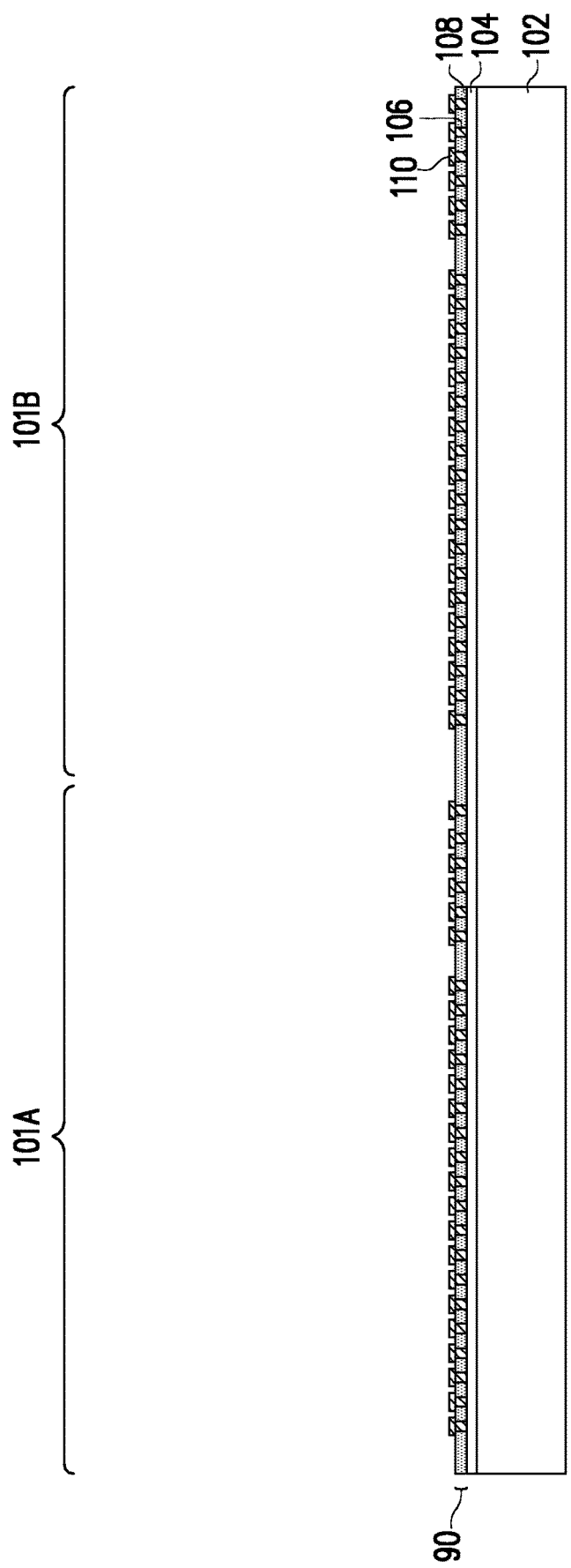

In FIG. 5, a dielectric layer 108 is formed on and around the conductive vias 106 and conductive lines 110 are formed on the dielectric layer 108 and conductive vias 106 in accordance with some embodiments. After formation, the dielectric layer 108 surrounds the conductive vias 106. The dielectric layer 108 may provide electrical isolation and environmental protection. The dielectric layer 108 and metallization pattern, including conductive vias 106, form a redistribution layer 90. The dielectric layer 108 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 108 may be formed, for example, by spin coating, lamination, chemical vapor deposition (CVD), or the like. The dielectric layer 108 may have an upper surface that is substantially level within process variations. In some embodiments, the dielectric layer is formed to have a thickness in a range from 2 μm to 50 μm.

After the dielectric layer 108 is formed, the conductive lines 110 are formed on the dielectric layer 108 and the conductive vias 106. As an example to form the conductive lines 110, a seed layer (not shown) is formed over the dielectric layer 108 and the conductive vias 106. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive lines 110. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 110 The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 6:
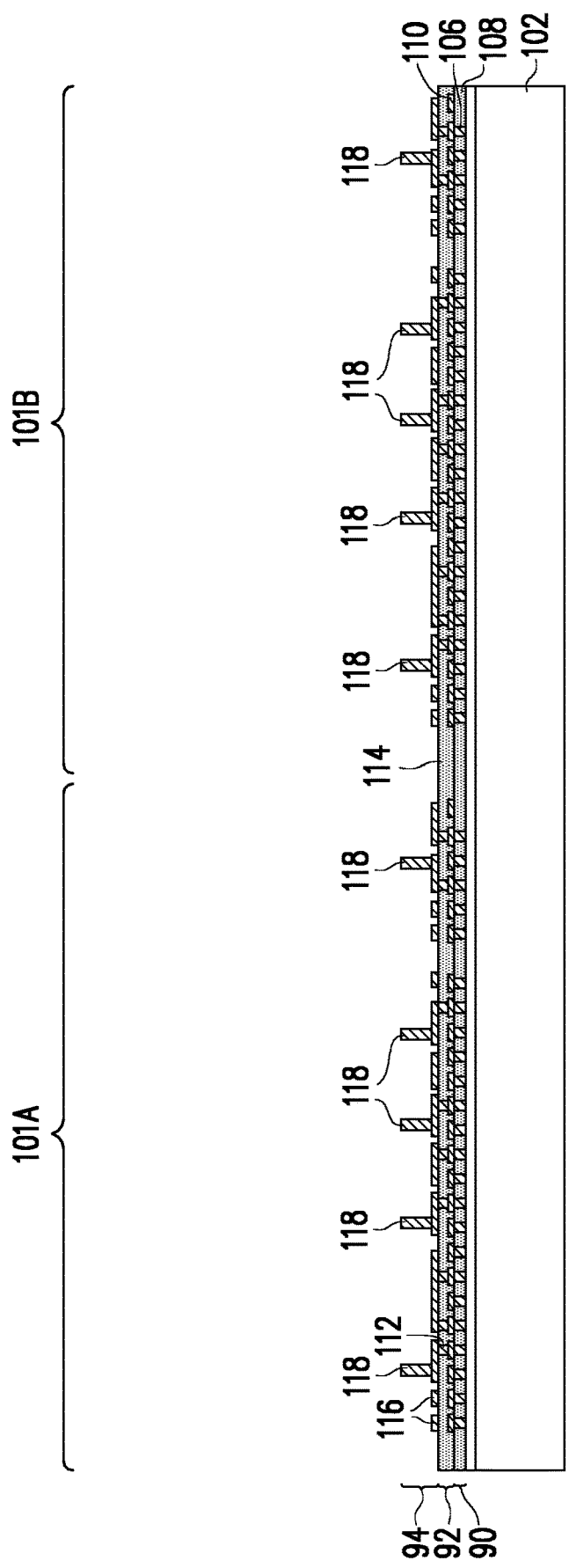

In FIG. 6, conductive vias 112 are formed on the conductive lines 110 and a dielectric layer 114 is formed on and around the conductive vias 112 and conductive lines 110 in accordance with some embodiments. Conductive lines 110 and conductive vias 112, together, form the metallization pattern for redistribution layer 92. The conductive vias 112 may be similar to the conductive vias 106 described above and the description is not repeated herein. The dielectric layer 114 may be similar to the dielectric layer 108 described above and the description is not repeated herein. The dielectric layer 114 and metallization pattern, including conductive vias 112 and conductive lines 110, form a redistribution layer 92. In some embodiments, the conductive vias 106 and 112 have widths in a range from 2 µm to 50 µm.

Further in FIG. 6, conductive lines 116 and conductive vias 118 are formed. The conductive lines 116 are formed over and connected to the conductive vias 112 and the conductive vias 118 are formed over and connected to the conductive lines 116. Conductive lines 116 and conductive vias 118, together, form the metallization pattern for redistribution layer 94. The conductive lines 116 and conductive vias 118 may be similar to the conductive lines 110 and conductive vias 106 described above and the description is not repeated herein. In some embodiments, the conductive vias 118 have a greater height than the conductive vias 106 and 112 as the conductive vias 118 act as a through dielectric vias adjacent the subsequently attached local interconnect components 120. In some embodiments, the conductive vias 118 have widths in a range from 5 µm to 100 µm.

Figure 7:
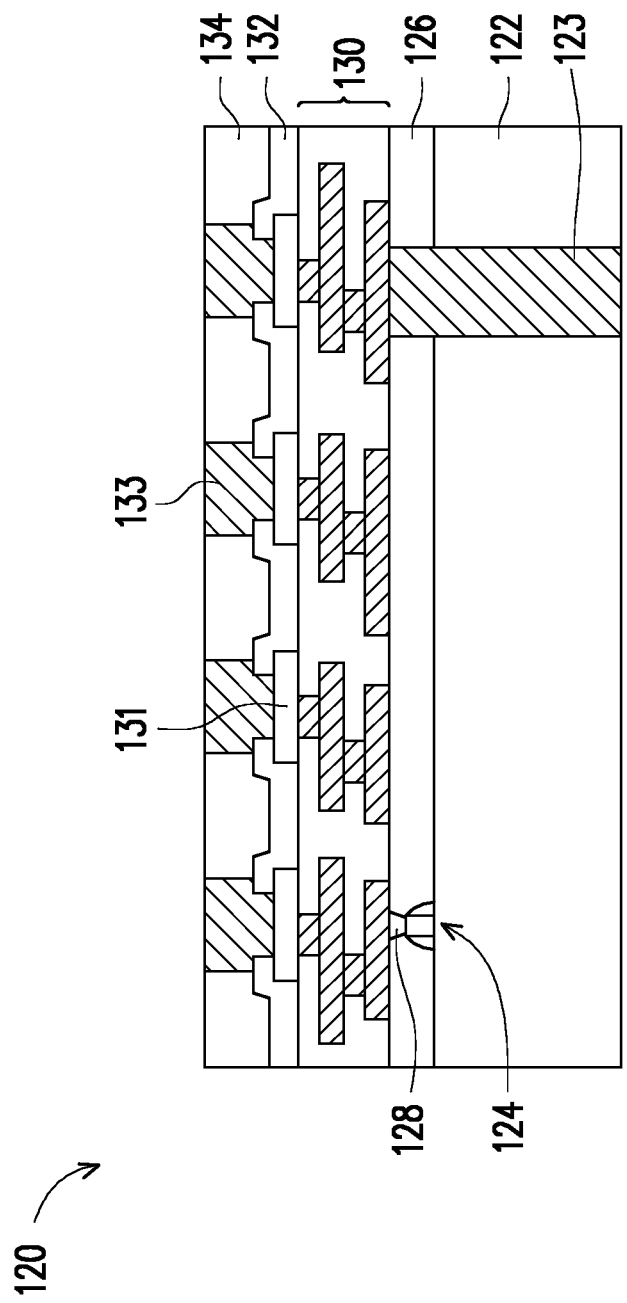

FIG. 7 illustrates a cross-sectional view of a local interconnect component 120 in accordance with some embodiments. The local interconnect component 120 will be embedded in subsequent processing in the redistribution structure 200.

The local interconnect component 120 may be formed in a wafer, which may include different device regions that are singulated in subsequent steps to form a plurality of local interconnect components. The local interconnect component 120 may be processed according to applicable manufacturing processes to form dies. For example, the local interconnect component 120 includes a substrate 122, such as silicon, doped or undoped, or an active layer of a semiconductor-on-insulator (SOI) substrate. The substrate 122 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 122 may be made up of a ceramic material, a polymer film, a magnetic material, the like or a combination thereof. Other substrates, such as multi-layered or gradient substrates, may also be used. The substrate 122 has an active surface (e.g., the surface facing upwards in FIG. 7), sometimes called a front side, and an inactive surface (e.g., the surface facing downwards in FIG. 7), sometimes called a back side.

In some embodiments, the local interconnect component 120 includes active or passive devices. In some embodiments, the local interconnect component 120 may be free of active or passive devices and may only be used for routing of electrical signals. In the embodiments that includes active or passive devices, devices (represented by a transistor) 124 may be formed at the front surface of the substrate 122. The devices 124 may be active devices (e.g., transistors, diodes, etc.), capacitors, resistors, inductors, etc. An inter-layer dielectric (ILD) 126 is over the front surface of the substrate 122. The ILD 126 surrounds and may cover the devices 124. The ILD 126 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 128 extend through the ILD 126 to electrically and physically couple the devices 124. For example, when the devices 124 are transistors, the conductive plugs 128 may couple the gates and source/drain regions of the transistors. The conductive plugs 128 may be formed of tungsten, cobalt, nickel, copper, silver, gold, aluminum, the like, or combinations thereof. An interconnect structure 130 is over the ILD 126 and conductive plugs 128. The interconnect structure 130 interconnects the devices 124 and/or provides electrical routing and connection between die connectors 133. The interconnect structure 130 may be formed by, for example, metallization patterns in dielectric layers on the ILD 126 using for example a damascene process. The metallization patterns include metal lines and vias formed in one or more low-k dielectric layers. In the embodiments, where devices 124 are included, the metallization patterns of the interconnect structure 130 are electrically coupled to the devices 124 by the conductive plugs 128. Although the interconnect structure 130 is illustrated with only two layers of conductive vias and two layers of conductive lines, in some embodiments, more or less layers of conductive vias and of conductive lines may be included as needed. For example, because the local interconnect component 120 is being used for electrical connection between the dies of the integrated circuit package 500, the interconnect structure 130 of the local interconnect component 120 will often have many more interconnect layers to accommodate this electrical connection.

In some embodiments, the local interconnect component 120 includes a through via 123 extending through the substrate 122 and/or the interconnect structure 130 to provide the ability to electrically couple this local interconnect component 120 to adjacent devices (e.g., devices above and below this local interconnect component 120). In some embodiments, the through via 123 is only formed through the substrate 122 and is coupled to the interconnect structure 130 and can utilize the conductive features of the interconnect structure 130 and pads 131 to be coupled to other devices. In some embodiments, the through via 123 is formed through the substrate 122 and the interconnect structure 130 and can utilize the pads 131 to be coupled to other devices. The through via 123 can be formed by patterning a hole in the substrate 122 and/or the interconnect structure 130 and forming a conductive material in the hole. The conductive material may be formed by a similar process as described above and below for conductive features in the interconnect structure 200 and the description is not repeated herein.

The local interconnect component 120 further includes pads 131, such as aluminum pads, to which external connections are made. The pads 131 are on the active side of the local interconnect component 120, such as in and/or on the interconnect structure 130. One or more passivation films 132 are on the local interconnect component 120, such as on portions of the interconnect structure 130 and pads 131. Openings extend through the passivation films 132 to the pads 131. Die connectors 133, such as conductive pillars (for example, formed of a metal such as copper), extend through the openings in the passivation films 132 and are physically and electrically coupled to respective ones of the pads 131. The die connectors 133 may be formed by, for example, plating, or the like. The die connectors 133 electrically couple the respective integrated circuits of the local interconnect component 120.

Solder regions (e.g., solder balls or solder bumps) may be disposed on the pads 131. The solder balls may be used to perform chip probe (CP) testing on the local interconnect component 120. CP testing may be performed on the local interconnect component 120 to ascertain whether the local interconnect component 120 is a known good die (KGD). Thus, only local interconnect components 120, which are KGDs, undergo subsequent processing are packaged, and dies, which fail the CP testing, are not packaged. After testing, these solder regions may be removed in subsequent processing steps.

A dielectric layer 134 may (or may not) be on the active side of the local interconnect component 120, such as on the passivation films 132 and the die connectors 133. The dielectric layer 134 laterally encapsulates the die connectors 133, and the dielectric layer 134 is laterally coterminous with the local interconnect component 120. Initially, the dielectric layer 134 may bury the die connectors 133, such that the topmost surface of the dielectric layer 134 is above the topmost surfaces of the die connectors 133. In some embodiments where solder regions are disposed on the die connectors 133, the dielectric layer 134 may bury the solder regions as well.

The dielectric layer 134 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 134 may be formed, for example, by spin coating, lamination, chemical vapor deposition (CVD), or the like. In some embodiments, the die connectors 133 are exposed through the dielectric layer 134 during formation of the local interconnect component 120. Exposing the die connectors 133 may remove any solder regions that may be present on the die connectors 133. In some embodiments, the die connectors 133 have a pitch in a range from 20 µm to 80 µm.

Figure 8:
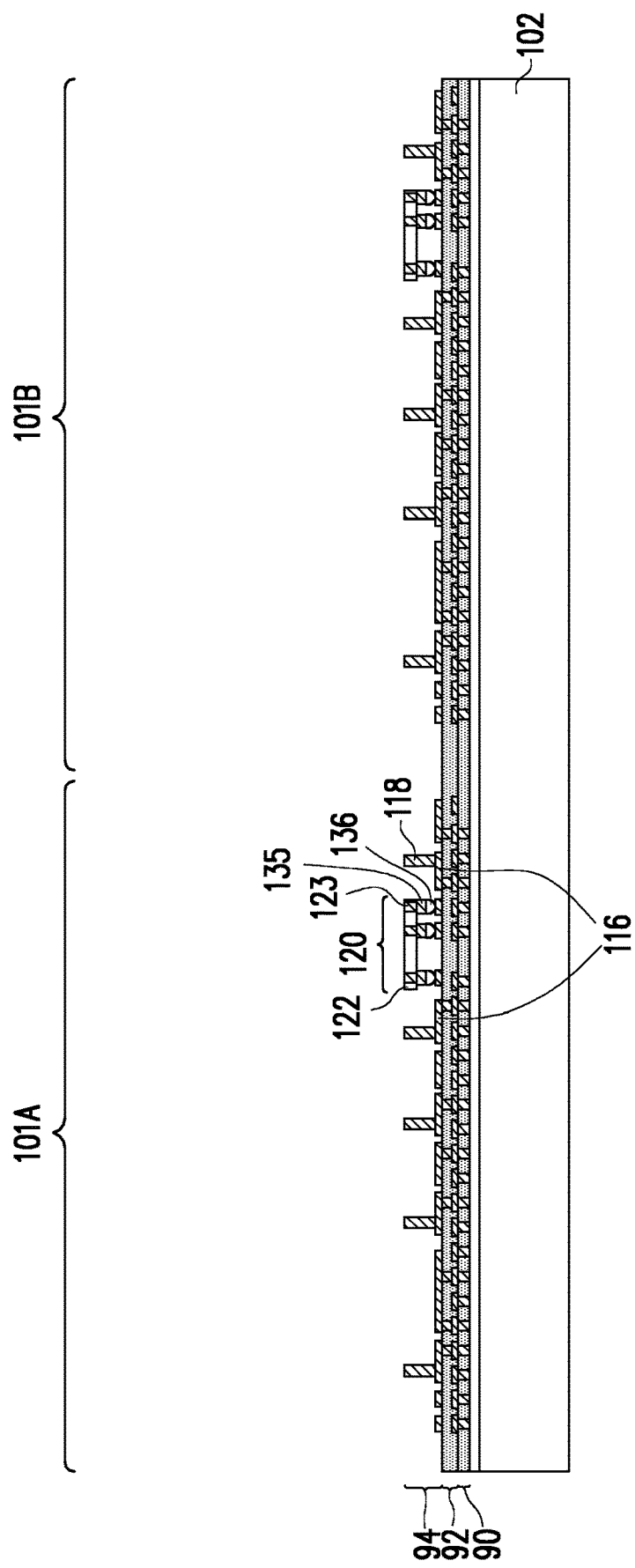

In FIG. 8, the local interconnect components 120 are bonded to the conductive lines 116 of the redistribution structure 200. In some embodiments, the local interconnect components 120 are bonded by solder regions (e.g., solder balls or solder bumps) 136. In some embodiments, under-bump metallizations (UBMs) 135 (sometimes referred to as pads or pillars 135) are formed on the die connectors 133 and the dielectric layer 134 for external connection to die connectors 133. As a result, the UBMs 135 are electrically coupled to the die connectors 133. The UBMs 135 may be formed of the same material as the conductive vias die connectors 133.

Further in FIG. 8, the solder regions 136 (sometimes referred to as conductive connectors 136) are formed on the UBMs 135. Solder regions 136 allow for physical and electrical connection to between the local interconnect components 120 and the conductive lines 116. The solder regions 136 may be ball grid array (BGA) connectors, solder balls, controlled collapse chip connection (C4) bumps, micro bumps, electroless nickel-electroless palladium-immersion gold technique (ENEPIG) formed bumps, or the like. The solder regions 136 may include a conductive material such as solder, copper, aluminum, gold, nickel, silver, palladium, tin, the like, or a combination thereof. In some embodiments, the solder regions 136 are formed by initially forming a layer of solder through evaporation, electroplating, printing, solder transfer, ball placement, or the like. Once a layer of solder has been formed on the structure, a reflow may be performed in order to shape the material into the desired bump shapes.

The local interconnect components 120 may be attached to the conductive lines 116 through the solder regions 136. Attaching the local interconnect components 120 may include placing the local interconnect components 120 on the conductive lines 116 and reflowing the solder regions 136 to physically and electrically couple the local interconnect components 120 and the conductive lines 116.

After the local interconnect components 120 are bonded, in some embodiments, the pads 135 have a pitch in a range from 20 µm to 80 µm. Further, in some embodiments, the thickness of the pads 135 together with the bonded solder regions 136 is in a range from 2 µm to 30 µm.

Figure 9:
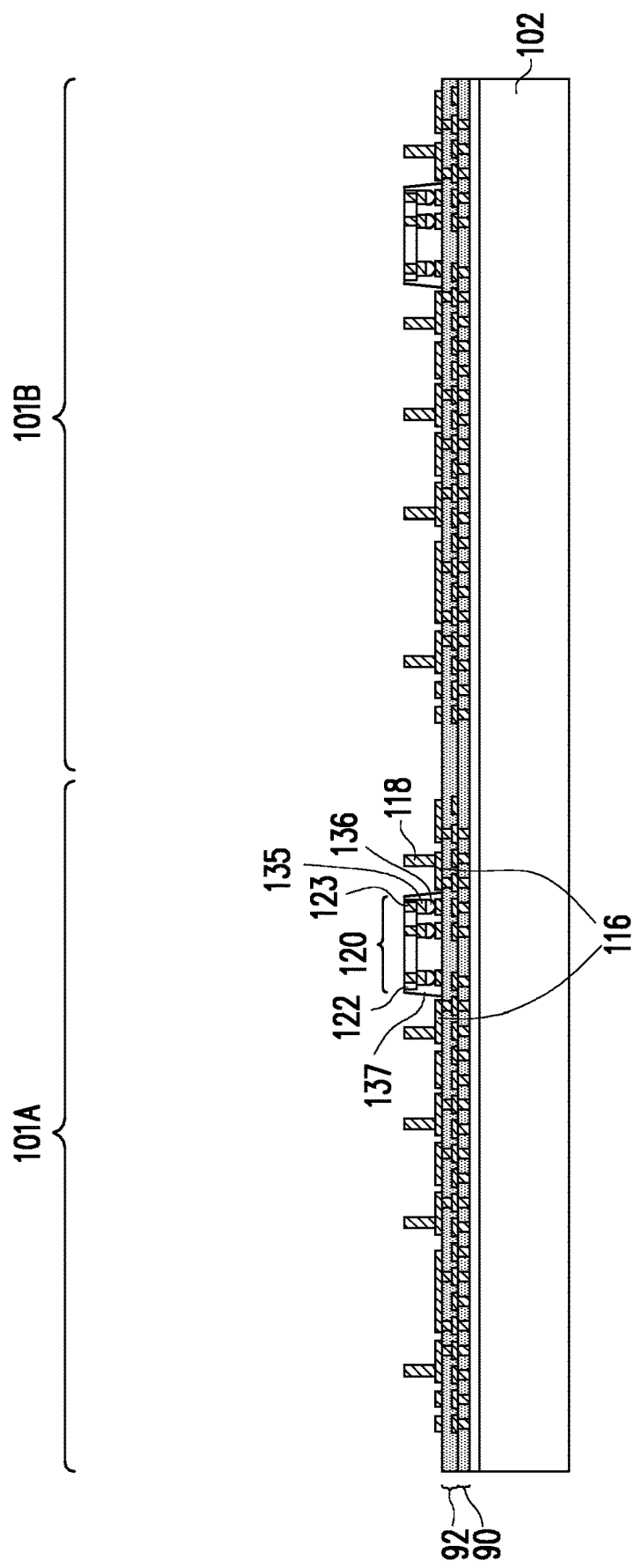

In FIG. 9, underfill 137 is formed surrounding the local interconnect components 120 between the local interconnect components 120 and the redistribution layer 92. The underfill 137 may reduce stress and protect the joints resulting from the reflowing of the conductive connectors 136. The underfill 137 may be formed by a capillary flow process after the local interconnect components 120 are attached, or may be formed by a suitable deposition method.

Figure 10:
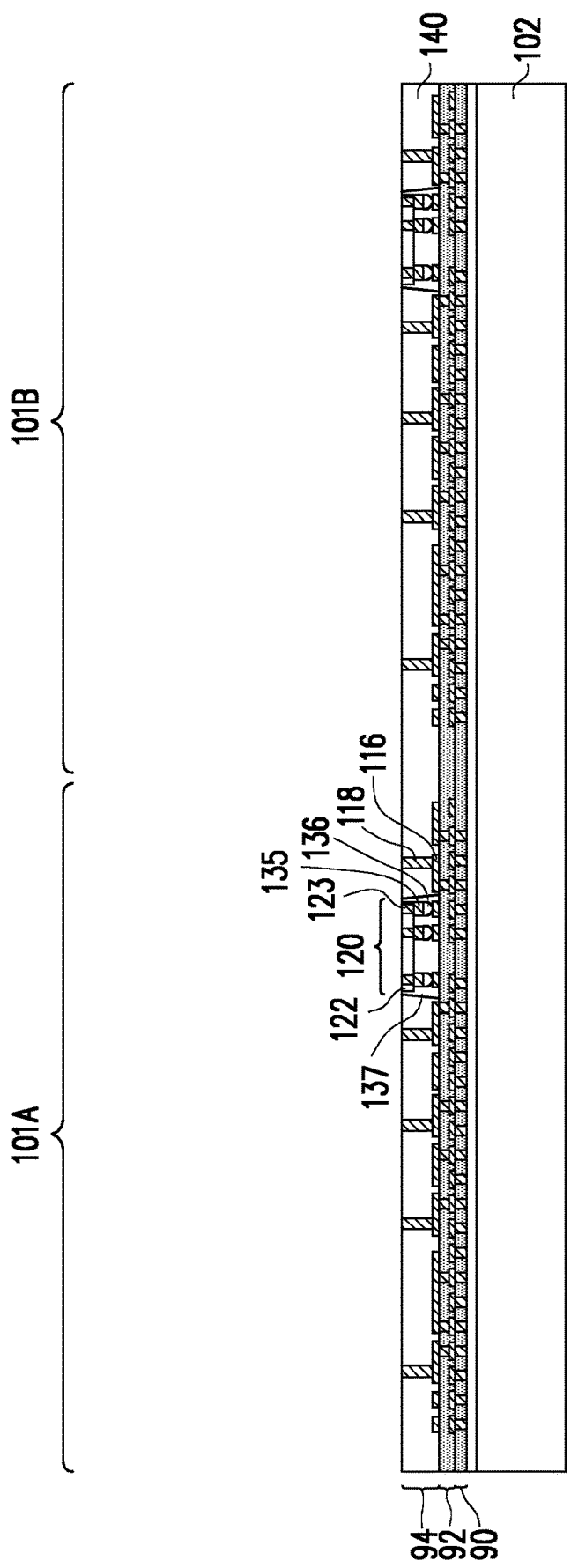

In FIG. 10, a dielectric layer 140 is formed on and around the conductive vias 118 and the local interconnect components 120 in accordance with some embodiments. The dielectric layer 140 encapsulates the local interconnect components 120 and the conductive vias 118. The dielectric layer 140, the local interconnect components 120, and metallization pattern, including conductive vias 118 and conductive lines 116, form a redistribution layer 94. The dielectric layer 140 (and the dielectric layers of redistribution layers 154, 158, and 162) may be a different material than the dielectric layers 108 and 114.

In some embodiments, the dielectric layer 140 may be formed of pre-preg, Ajinomoto Build-up Film (ABF), resin coated copper (RCC), molding compound, polyimide, photo-imageable dielectric (PID), epoxy, or the like, and may be applied by compression molding, transfer molding, or the like. The encapsulant may be applied in liquid or semi-liquid form and then subsequently cured. In some embodiments, the dielectric layer 140 is formed over the dielectric layer 114 such that the conductive lines 110, conductive vias 118, and local interconnect components are buried or covered, and a planarization process is then performed on the dielectric layer 140 to expose the conductive vias 118 and the backsides of the substrates 122 of the local interconnect components 120. Topmost surfaces of the dielectric layer 140, conductive vias 118, and the substrates 122 of the local interconnect components 120 are substantially level (e.g., planar) within process variations after the planarization process. The planarization process may be, for example, a chemical-mechanical polish (CMP). In some embodiments, the dielectric layer 140 may comprise other materials, such as silicon oxide, silicon nitride, or the like. After the planarization process (if any), the thickness of the local interconnect components is in a range from 10 µm to 100 µm. In some embodiments, the substrates 122 of the local interconnect components 120 have a thickness in a range from 2 µm to 30 µm. The area in a plan view of the substrates 122 of the local interconnect components 120 can be in a range from 2 mm×3 mm to 50 mm×80 mm.

The local interconnect components 120 provide electrical connection between the subsequently attached integrated circuit dies (e.g., 512 and 514). The embedded local interconnect components 120 increases the communication bandwidth between the integrated circuit dies while maintaining low contact resistance and high reliability. In some embodiments, other components such as an integrated voltage regulator, an integrated passive device, a static random-access-memory, the like, or a combination thereof can also be embedded in a similar manner as the embedded local interconnect component.

Figure 11A:
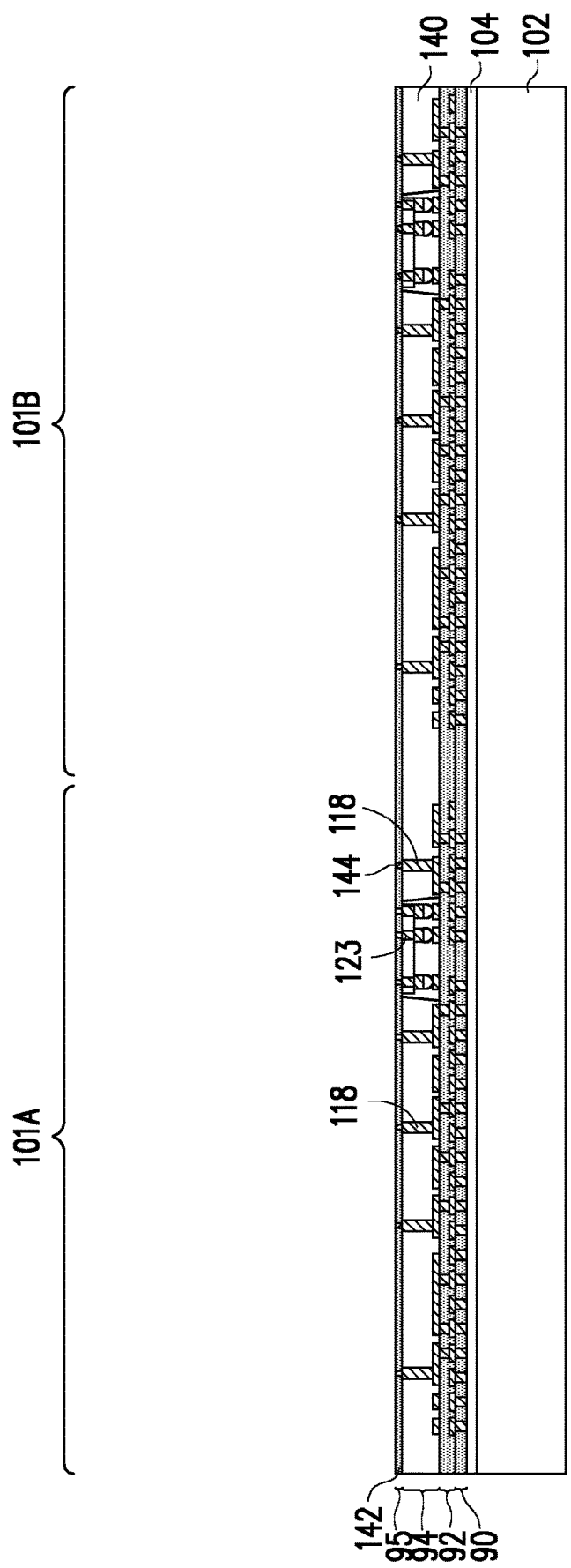
Figure 11B:
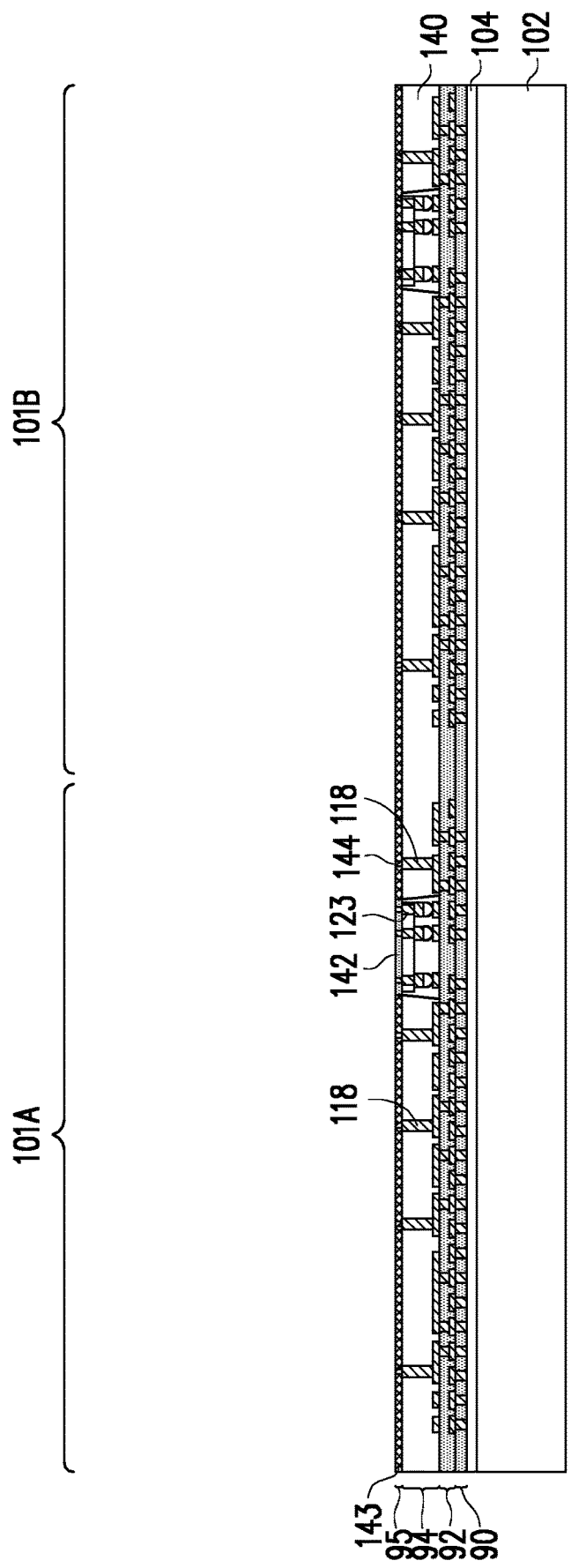

FIGS. 11A and 11B illustrate two embodiments of the formation of dielectric layer 142. In FIG. 11A, the dielectric layer 142 is formed on the dielectric layer 140, the local interconnect components 120, and the conductive vias 118. In FIG. 11B, the dielectric layer 142 is only formed on the local interconnect components 120 and a dielectric layer 143 is formed over the dielectric layer 140 and the conductive vias 118. In FIG. 11B, the dielectric layer 143 at least laterally surrounds the dielectric layer 142. The embodiment of FIG. 11B can be achieved by forming the dielectric layer as shown in FIG. 11A and then removing portions of the dielectric layer 142 not on the local interconnect component 120 by, for example, masking and patterning steps. Also, the embodiment of FIG. 11B can be achieved by selectively forming the dielectric layer 142 on the local interconnect component 120 by, for example, forming and patterning a mask before depositing the dielectric layer 142.

Further in FIG. 11A, conductive vias 144 are formed in the dielectric layer 142. The conductive vias 144 are over and electrically coupled to the conductive vias 118 and the through vias 123 in the local interconnect components. The dielectric layer 142 and the conductive vias 144 may be similar to the dielectric layer 108 and the conductive vias 106 described above and the descriptions are not repeated herein. The dielectric layer 142 and the conductive vias 144 form a redistribution layer 95.

Further in FIG. 11B, conductive vias 144 are formed in the dielectric layer 142 and the dielectric layer 143. The conductive vias 144 are over and electrically coupled to the conductive vias 118 and the through vias 123 in the local interconnect components. The dielectric layer 142 and the conductive vias 144 may be similar to the dielectric layer 108 and the conductive vias 106 described above and the descriptions are not repeated herein. The dielectric layer 142 the conductive vias 144 form a redistribution layer 95. The dielectric layer 143 may be similar to the dielectric layer 140 described above and the description is not repeated herein. In some embodiments, the dielectric layers 142 and 143 are formed of different materials. In some embodiments, the conductive vias 144 in the dielectric layer 142 are smaller than the conductive vias 144 in the dielectric layer 143. For example, when the dielectric layer 142 is formed of polyimide and the dielectric layer 143 is formed of molding compound, the size of the via openings in the dielectric layer 142 can be made smaller than the size of the via openings in the dielectric layer 143.

FIGS. 12 through 23 illustrate subsequent processing on the embodiment of FIG. 11A, and the subsequent processing is also applicable to the embodiment of FIG. 11B.

Figure 12:
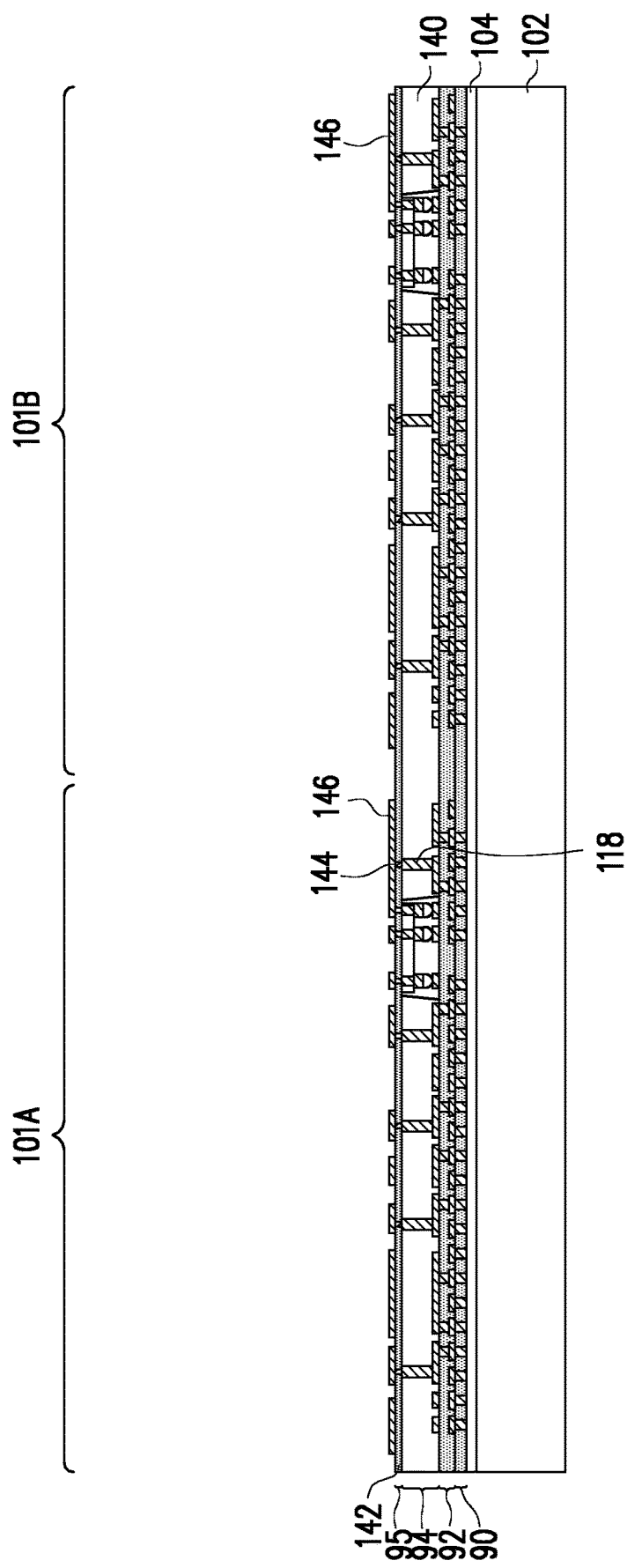

In FIG. 12 conductive lines 146 are formed on the dielectric layer 142 and the conductive vias 144 and connected to the conductive vias 118. The conductive lines 146 may be similar to the conductive lines 110 described above and the description is not repeated herein.

Figure 13:
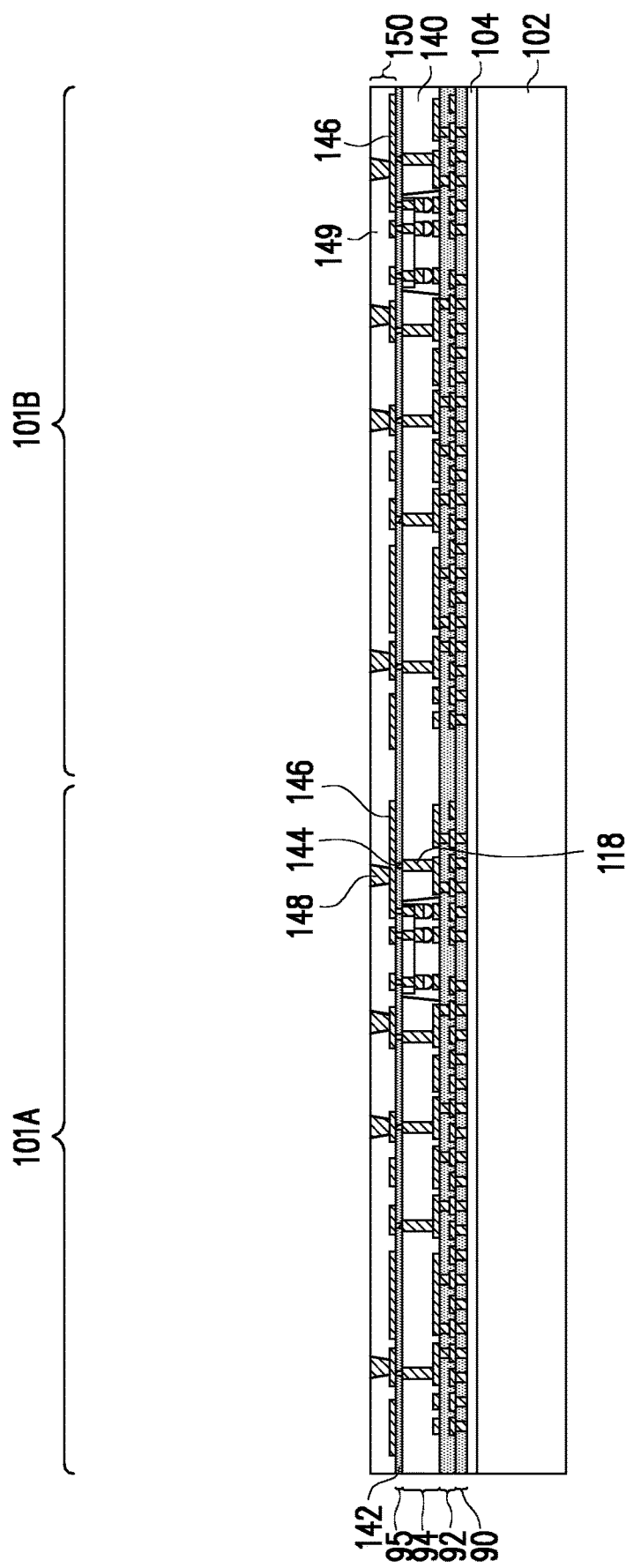

In FIG. 13, conductive vias 148 are formed on and extending from the conductive lines 146. The conductive vias 148 may be similar to the conductive vias 106 described above and the description is not repeated herein. Conductive lines 146 and conductive vias 148, together, form the metallization pattern for redistribution layer 150.

Further in FIG. 13, a dielectric layer 149 is formed on and around the conductive lines 146 and the conductive vias 148 in accordance with some embodiments. After formation, the dielectric layer 149 surrounds the conductive vias 148 and conductive lines 146. The dielectric layer 149 and metallization pattern, including conductive vias 148 and conductive lines 146, form a redistribution layer 150. The dielectric layer 149 may be similar to the dielectric layer 140 described above and the description is not repeated herein. In some embodiments, the dielectric layer 149 is formed over the dielectric layer 142 such that the conductive lines 146 and conductive vias 148 are buried or covered, and a planarization process is then performed on the dielectric layer 149 to expose the conductive vias 148. Topmost surfaces of the dielectric layer 149 and conductive vias 148 are substantially level (e.g., planar) within process variations after the planarization process. The planarization process may be, for example, a CMP. In some embodiments, the dielectric layer 149 may comprise other materials, such as silicon oxide, silicon nitride, or the like.

Figure 14:
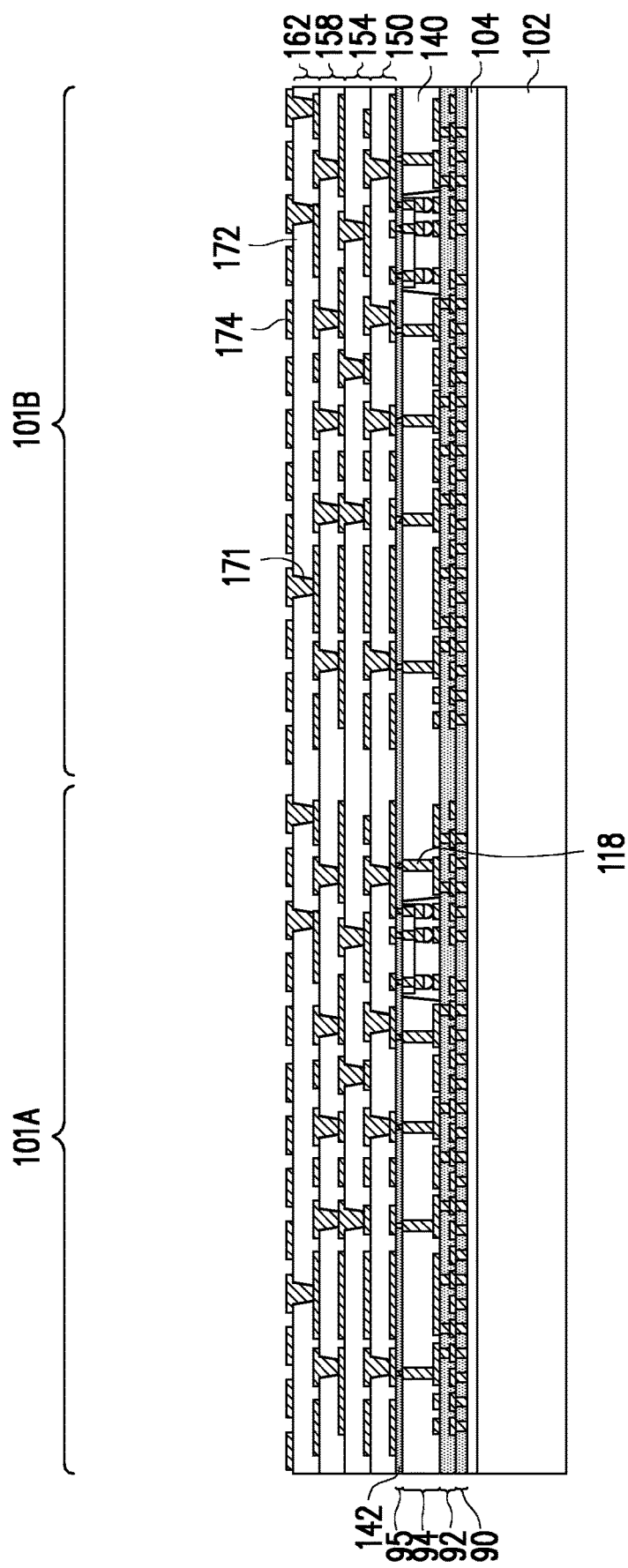

In FIG. 14, the steps and process discussed above to form redistribution layer 150 are repeated to form additionally shown redistribution layers 154, 158, and 162. In some embodiments, the process described above to form the redistribution layer 150 may be repeated one or more times to provide additional routing layers as desired for a particular design. Eight redistribution layers 90, 92, 94, 95, 150, 154, 158, and 162 are shown for illustrative purposes. In some embodiments more or less than eight may be used. The metallization patterns for each redistribution layer 90, 92, 94, 95, 150, 154, 158, and 162 may have separately formed conductive lines and conductive vias (as shown), or may each be a single pattern having line and via portions. In some embodiments, the conductive vias of the redistribution layers 150, 154, 158, and 162 have widths in a range from 2 μm to 100 μm, such as 30 μm.

Although the conductive vias in the redistribution layers 150, 154, 158, and 162 are shown with tapered sidewalls and the conductive vias in the redistribution layers 90, 92, and 94 are shown with non-tapered sidewalls, the sidewalls of the conductive vias of each of the redistribution layers 90, 92, 94, 95, 150, 154, 158, and 162 may be tapered, non-tapered, or a combination thereof. In some embodiments, the sidewall profiles of the conductive vias is controlled to be tapered or non-tapered by controlling the lithography and etching processes that form the openings in which the conductive vias are formed.

In some embodiments, an additional set of conductive lines 174 are formed over each conductive via 171 and portion of the dielectric layer 172 of the uppermost redistribution layer, e.g., the redistribution layer 162 in the illustrated embodiment. This additional set of conductive lines 174 provides a larger dimensional footprint for connecting a core substrate as discussed below.

Where encapsulant and a subsequent CMP process is used to planarize redistribution layers 150, 154, 158, and 162, the dimensions, and roughness of the associated layers can be well controlled and more easily built up to larger thicknesses. In some embodiments, the thickness of redistribution layers 150, 154, 158, and 162 is each between 5 μm and 100 μm. More or fewer redistribution layers may be formed by, respectively, repeating or omitting the steps and process discussed above.

Although FIGS. 4 through 14 illustrate a formation process that forms conductive lines and vias before the dielectric layer that surrounds the conductive lines and vias, other formation processes are within the scope of this disclosure. For example, in other embodiments, a dielectric layer is first formed and then the metallization pattern (which includes both lines and vias) are formed. The metallization pattern includes conductive elements extending along the major surface of the dielectric layer and extending through the dielectric layer to physically and electrically couple to an underlying conductive layer. As an example to form the metallization pattern, openings are formed through the dielectric layer in the locations where vias are desired and a seed layer is formed over the dielectric layer and in the openings extending through the dielectric layer. A photoresist is then formed and patterned on the seed layer. The patterning forms openings through the photoresist to expose the seed layer, with the pattern of the openings corresponding to the metallization pattern. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern. The photoresist and portions of the seed layer on which the conductive material is not formed are removed. Once the photoresist is removed, exposed portions of the seed layer are removed, such as by using an acceptable etching process, such as by wet or dry etching. The combination of the dielectric layer and the metallization pattern form the redistribution layer.

Figure 15:
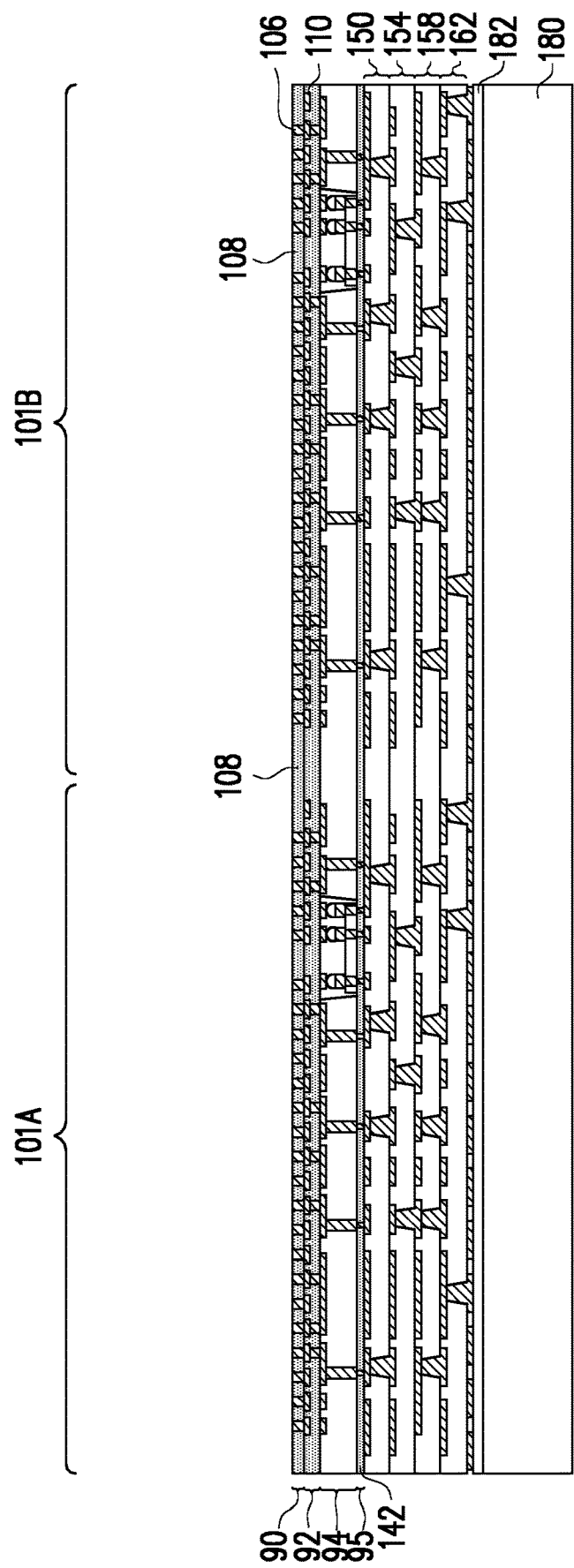

In FIG. 15, a carrier substrate de-bonding is performed to detach (or "de-bond") the carrier substrate 102 from the dielectric layer 108 and conductive vias 106. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on another carrier substrate 180 and release layer 182.

A planarization process may be performed, if necessary, on the dielectric layer 108 and conductive vias 106 (and any remaining release layer 104) to expose the conductive vias 106. Topmost surfaces of the dielectric layer 108 and conductive vias 106 are substantially level (e.g., planar) after the planarization process within process variations. The planarization process may be, for example, a chemical-mechanical polish (CMP), a grinding process, or the like. In some embodiments, the planarization may be omitted, for example, if the conductive vias 106 are already exposed. Other processes may be used to achieve a similar result. For example, a dielectric or passivation layer may be formed over conductive vias 106 after the debonding process. In such cases, the dielectric or passivation layer may be patterned in a subsequent step to expose portions of the conductive vias 106.

Figure 16:
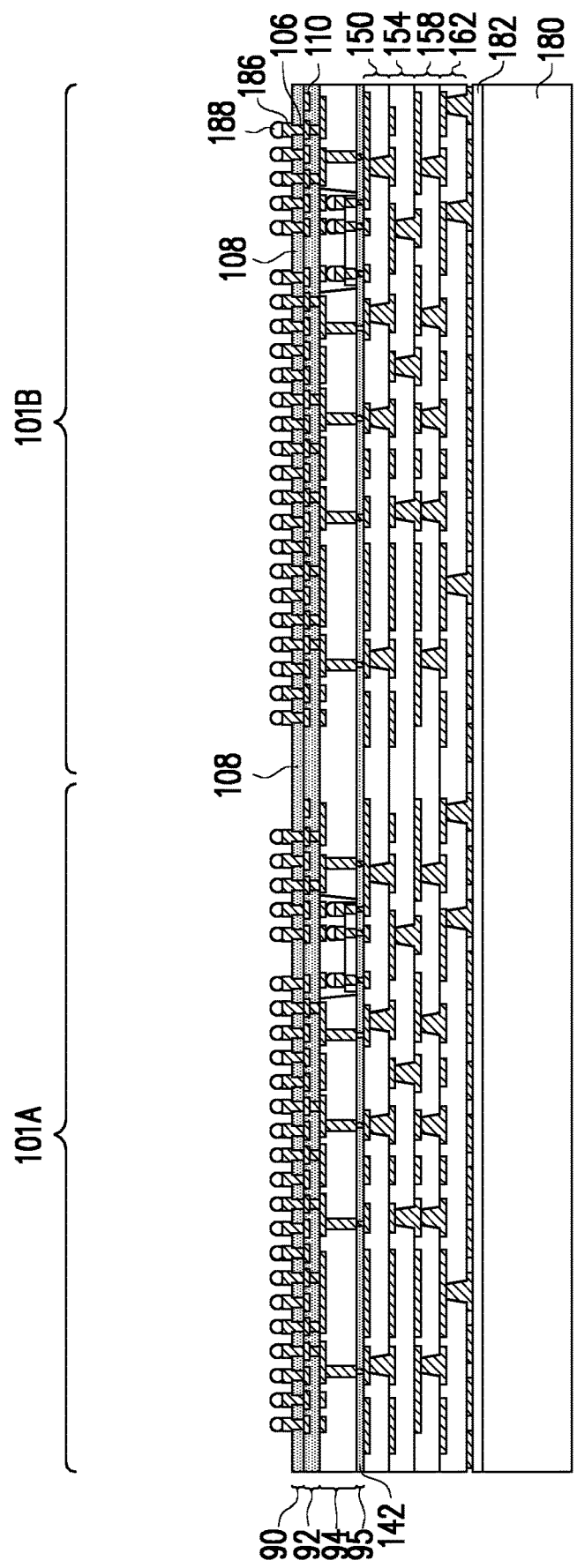

In FIG. 16, under-bump metallizations (UBMs) 186 (sometimes referred to as pads 186) are formed for external connection to conductive vias 106. The UBMs 186 have bump portions on and extending along the major surface of the dielectric layer 108, and may have via portions extending into the dielectric layer 108 to physically and electrically couple the conductive via 106. As a result, the UBMs 186 are electrically coupled to the through conductive lines 110 and the local interconnect components 120. The UBMs 186 may be formed of the same material as the conductive vias 106. In some embodiments, the UBMs 186 have a pitch in a range from 20 μm to 80 μm.

In FIG. 16, conductive connectors 188 are formed on the UBMs 186. The conductive connectors 188 allow for physical and electrical connection to dies or another package structure. The conductive connectors 188 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 188 may include a conductive material such as solder, copper, aluminum, gold, nickel, silver, palladium, tin, the like, or a combination thereof. In some embodiments, the conductive connectors 188 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 188 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 17:
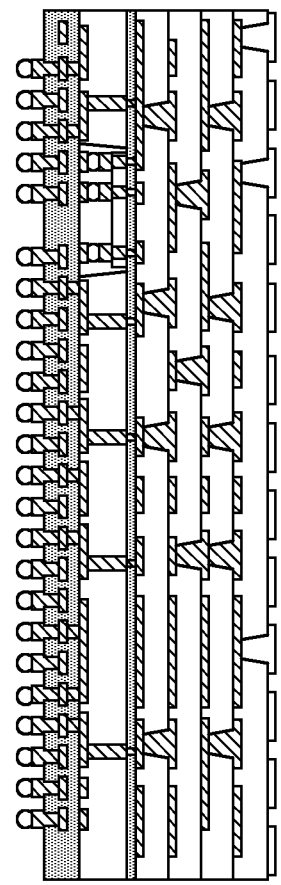
FIG. 17 illustrates a planar view of the layout of package regions on a wafer substrate in accordance with some embodiments.
Figure 17:
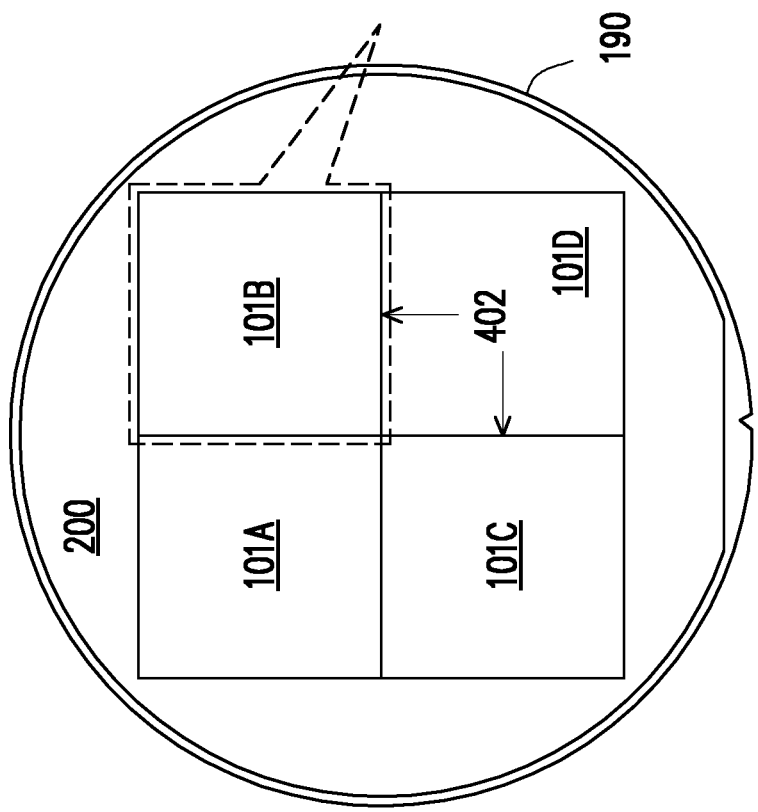

The redistribution structure 200 may be larger and include multiple package regions, such as the first package region 101A and second package region 101B. For example, FIG. 17 illustrates the redistribution structure 200 having a circular wafer shape with multiple package regions. In the embodiment shown, four package regions 101A, 101B, 101C, and 101D are included on the wafer allowing for four final package components to be fabricated on a single wafer and later singulated. Fewer or more package regions may be utilized on a single wafer in other embodiments. Subsequent steps in the process use the redistribution structure 200 on a wafer form frame 190 as the base upon which to continue the fabrication process described in further detail below. As described in further detail below, the individual package regions are singulated by sawing along lines 402 and around the outer edges of package regions 101A, 101B, 101C, and 101D.

Figure 18:
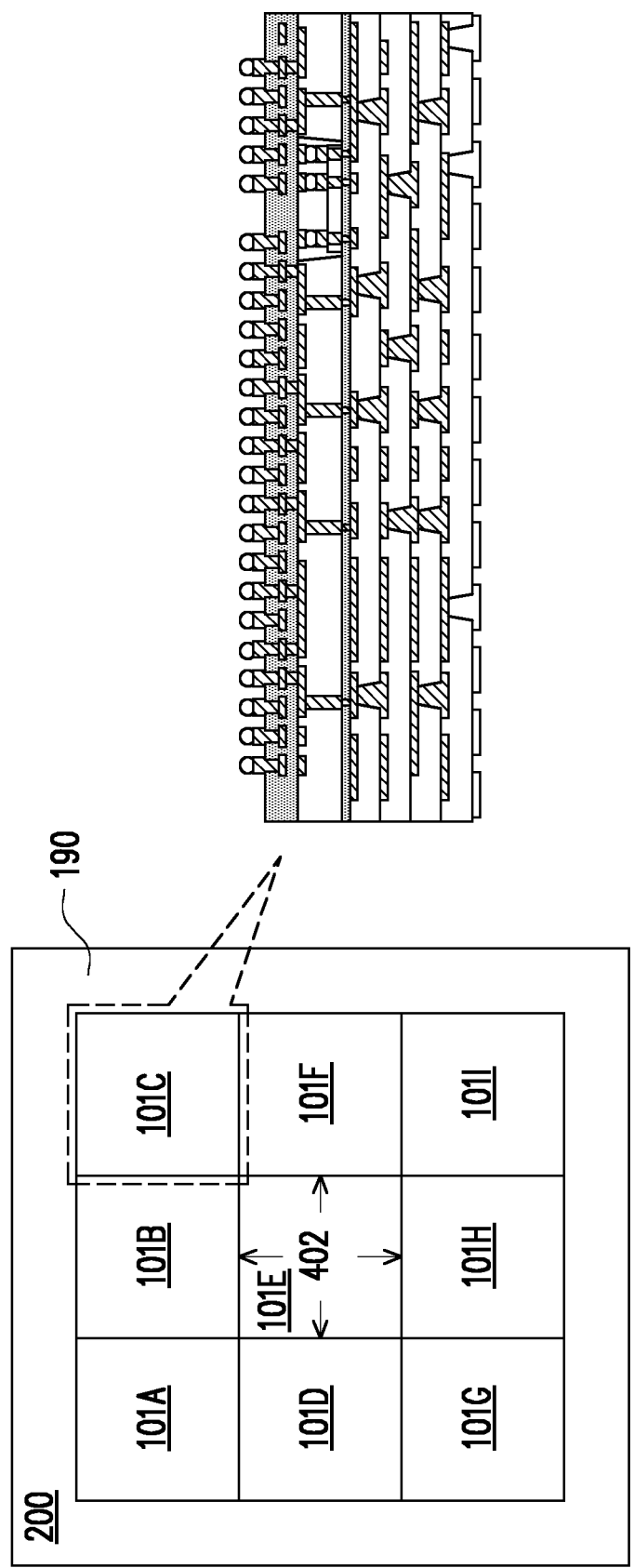
FIG. 18 illustrates a planar view of the layout of package regions on a panel substrate in accordance with some embodiments.

FIG. 18 illustrates the redistribution structure 200 being manufactured using a panel form fabrication process with multiple package regions. In the embodiment shown, nine package regions 101A through 101I are included on the wafer allowing for nine final package components to be fabricated on a single wafer or panel. Fewer or more package regions may be utilized on a single wafer or panel in other embodiments. Subsequent steps in the process use the redistribution structure 200 on a panel form frame 190 as the base upon which to continue the fabrication process described in further detail below. As described in further detail below, the individual package regions are singulated by sawing along lines 402 and around the perimeter of package regions 101A through 101I.

Figure 19:
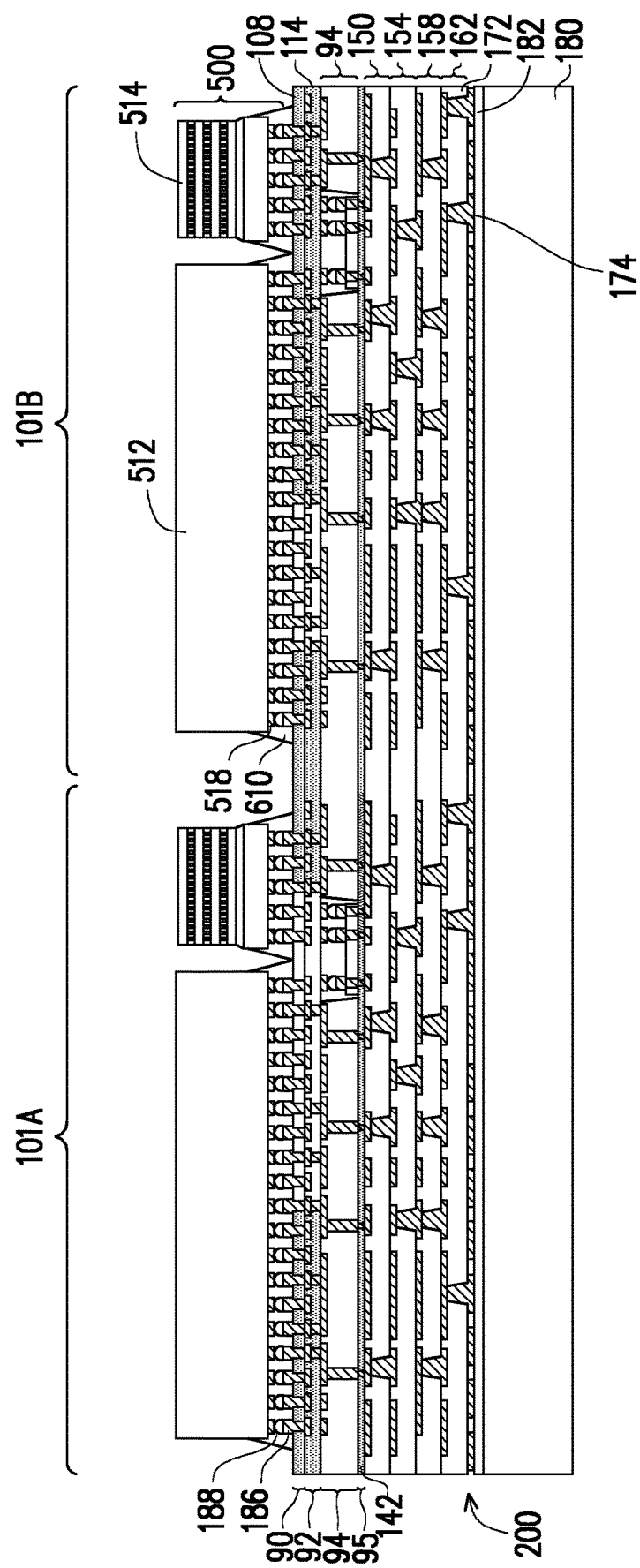

In FIG. 19, the integrated circuit package 500, as shown in FIG. 1, may be attached to the redistribution structure 200 through the conductive connectors 188. The conductive connectors 188 attach the integrated circuit package 500 to the UBMs 186 and redistribution structure 200. Attaching the integrated circuit package 500 may include placing the dies 512 and 514 of the integrated circuit package 500 on the conductive connectors 188 and reflowing the conductive connectors 188 to physically and electrically couple the integrated circuit package 500 and the redistribution structure 200.

In some embodiments, an underfill 610 is formed surrounding the conductive connectors 188 between the integrated circuit package 500 and the redistribution structure 200. The underfill 610 may reduce stress and protect the joints resulting from the reflowing of the conductive connectors 188. The underfill 610 may be formed by a capillary flow process after the integrated circuit package 500 is attached, or may be formed by a suitable deposition method. In some embodiments, a single layer of underfill 610 is formed beneath multiple adjacent devices, and further subsequent underfills (not shown) or encapsulants (not shown)

may be formed beneath and/or around additional devices placed on top of the redistribution structure 200.

Figure 20:
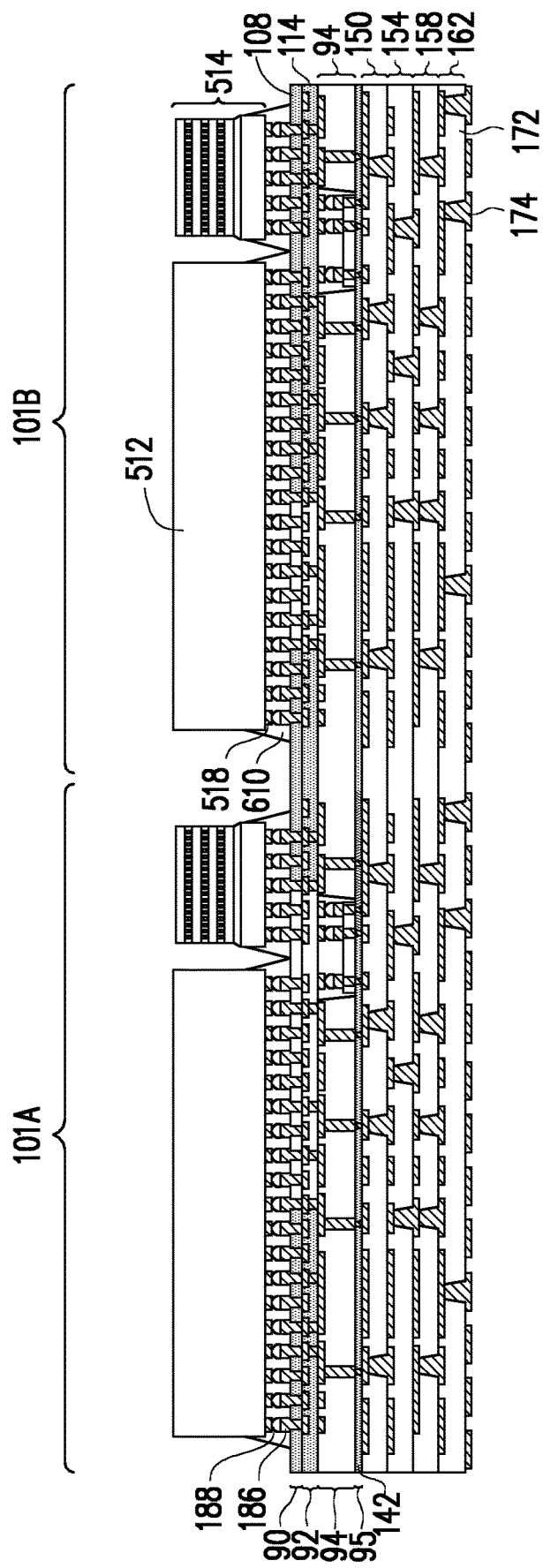

In FIG. 20, a carrier substrate de-bonding is performed to detach (or "de-bond") the carrier substrate 180 from the conductive lines 174 and/or the dielectric layer 172. In accordance with some embodiments, the de-bonding includes projecting a light such as a laser light or an UV light on the release layer 182 so that the release layer 182 decomposes under the heat of the light and the carrier substrate 180 can be removed.

Figure 21:
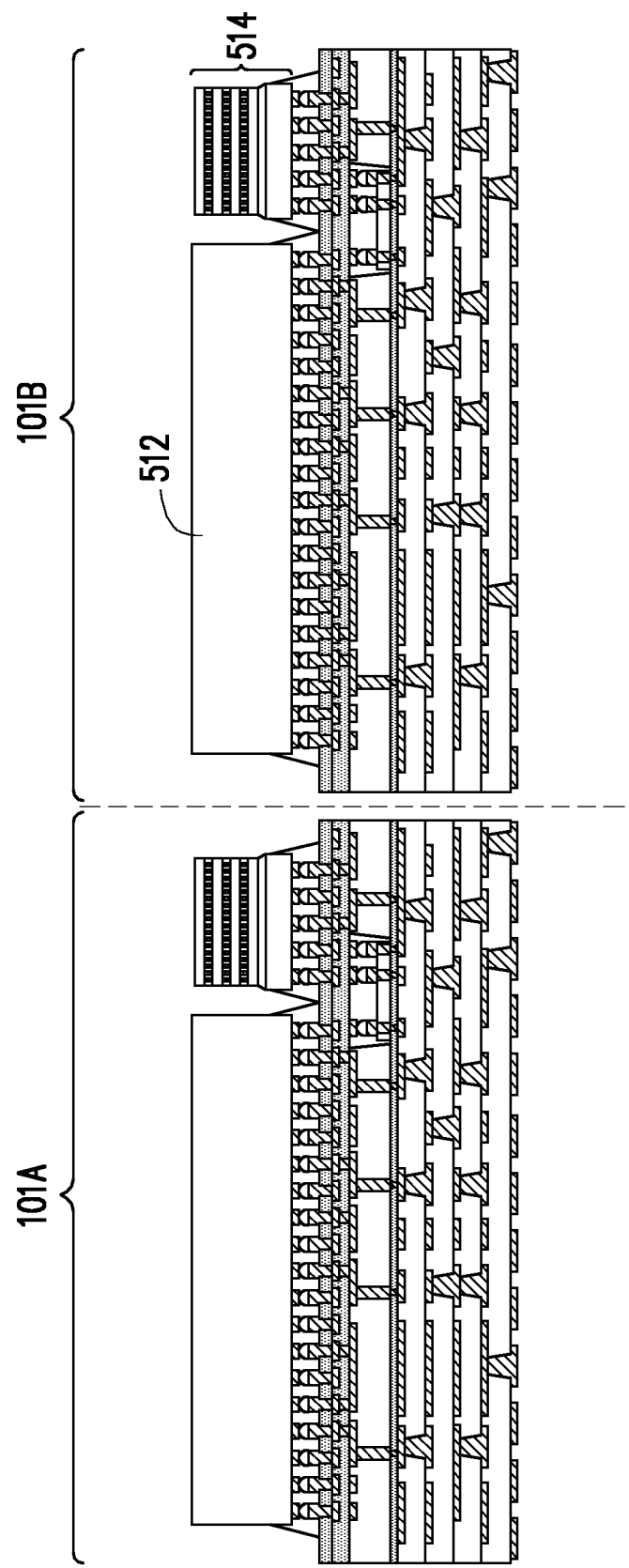

Further in FIG. 21, a singulation process is performed by sawing along scribe line regions, e.g., between the first package region 101A and the second package region 101B. The sawing singulates the first package region 101A from adjacent package regions, including second package region 101B (shown) to form multiple singulated package components 100.

Figure 22:
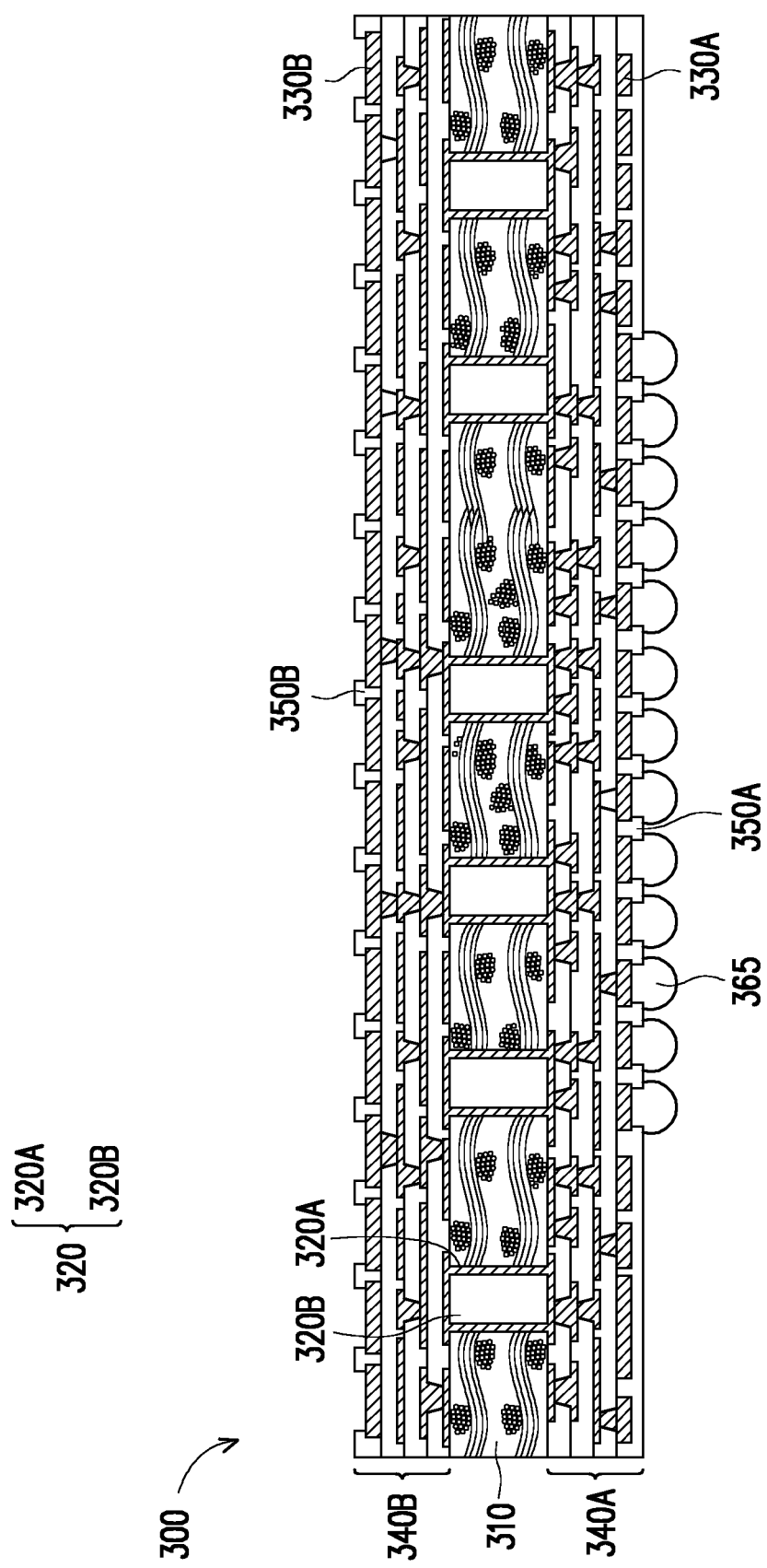
Figure 23:
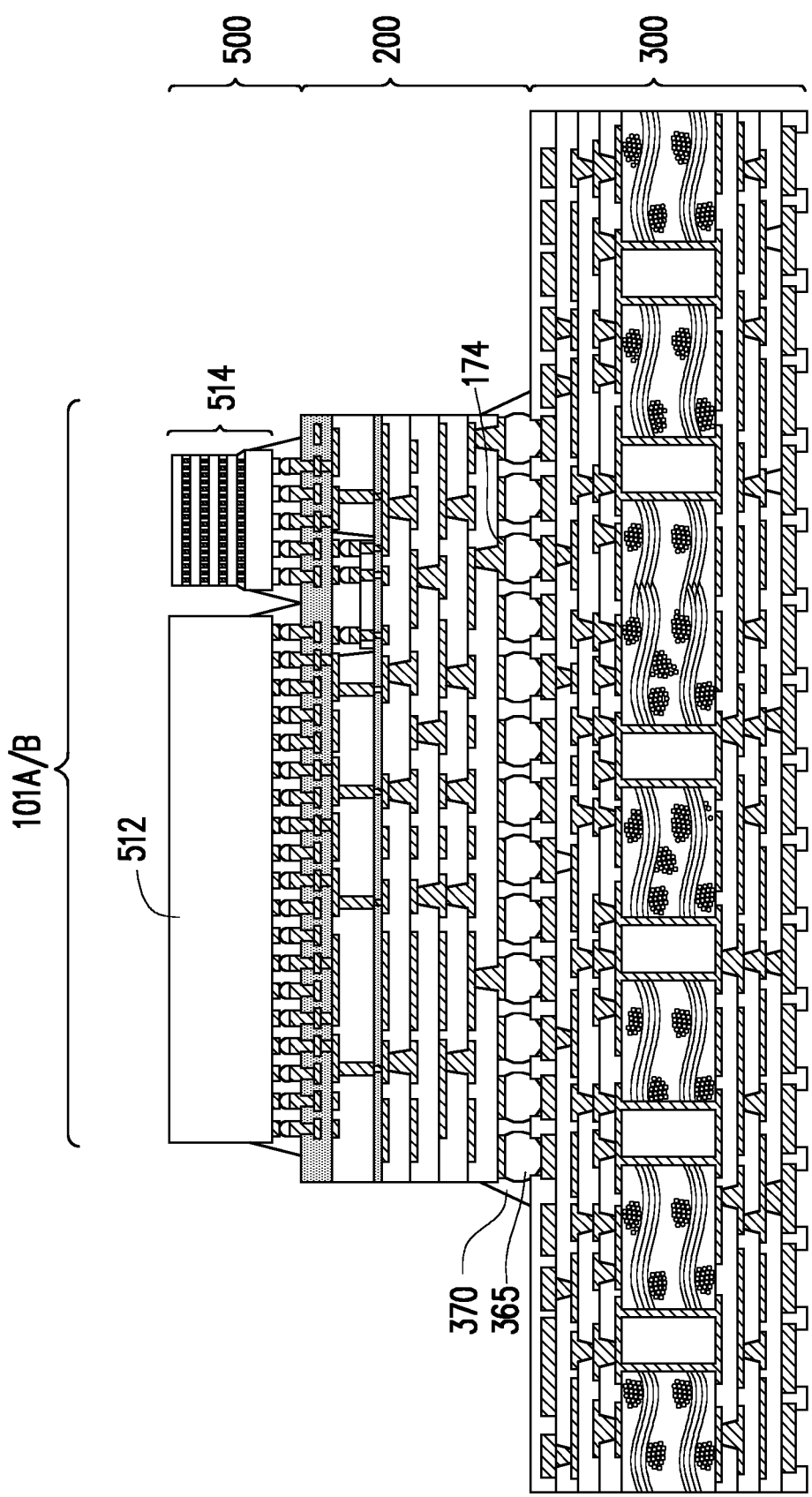

In FIG. 22, a core substrate 300 is illustrated and, in FIG. 23, is bonded to the redistribution structure 200. Utilizing the core substrate 300 has the advantage of having the core substrate 300 being manufactured in a separate process. In addition, because core substrate 300 is formed in a separate process, it can be tested separately so that a known good core substrate 300 is used. For example, in some embodiments, the core substrate 300 may be individually or batch tested, validated, and/or verified prior to bonding the core substrate 300 to the redistribution structure 200.

The core substrate 300 may be, e.g., an organic substrate, a ceramic substrate, a silicon substrate, or the like. Conductive connectors 365 are used to attach the core substrate 300 to the redistribution structure 200. Attaching the core substrate 300 may include placing the core substrate 300 on the redistribution structure 200 and reflowing the conductive connectors 365 to physically and electrically couple the core substrate 300 and the redistribution structure 200.

Before being attached to the redistribution structure 200, the core substrate 300 may be processed according to applicable manufacturing processes to form redistribution structures in the core substrate 300. For example, the core substrate 300 includes a core 310. The core 310 may be formed of one or more layers of glass fiber, resin, filler, pre-preg, epoxy, silica filler, Ajinomoto Build-up Film (ABF), polyimide, molding compound, other materials, and/or combinations thereof. In some embodiments, for example, two layers are of material make up the core 310. The core 310 may be formed of organic and/or inorganic materials. In some embodiments, the core 310 includes one or more passive components (not shown) embedded inside. The core 310 may comprise other materials or components. Conductive vias 320 are formed extending through the core 310. The conductive vias 320 comprise a conductive material 320A such as copper, a copper alloy, or other conductors, and may include a barrier layer (not shown), liner (not shown), seed layer (not shown), and/or a fill material 320B, in some embodiments. The conductive vias 320 provide vertical electrical connections from one side of the core 310 to the other side of the core 310. For example, some of the conductive vias 320 are coupled between conductive features at one side of the core 310 and conductive features at an opposite side of the core 310. Holes for the conductive vias 320 may be formed using a drilling process, photolithography, a laser process, or other methods, as examples, and the holes of the conductive vias 320 are then filled or plated with conductive material. In some embodiments, the conductive vias 320 are hollow conductive through vias having centers that are filled with an insulating material. Redistribution structures 340A and 340B are formed on opposing sides of the core 310. The redistribution structures 340A and 340B are electrically coupled by the conductive vias 320, and fan-in/fan-out electrical signals.

The redistribution structures 340A and 340B each include dielectric layers, formed of ABF, pre-preg, or the like, and metallization patterns. Each respective metallization pattern has line portions on and extending along a major surface of a respective dielectric layer, and has via portions extending through the respective dielectric layer. The redistribution structures 340A and 340B each, respectively, include under-bump metallurgies (UBMs) 330A and 330B for external connection, and solder resists 350A and 350B protecting the features of the redistribution structures 340A and 340B. The redistribution structure 340A is attached to the redistribution structure 200 by the UBMs 330A through the conductive connectors 365 as illustrated in FIG. 23. More or fewer dielectric layers and metallization patterns may be formed in the redistribution structures 340A and 340B than shown in FIG. 22.

The core substrate 300 may include active and passive devices (not shown), or may be free from either active devices, passive devices, or both. A wide variety of devices such as transistors, capacitors, resistors, inductors, combinations of these, and the like may be used. The devices may be formed using any suitable methods.

Conductive connectors 365 may be used to bond the core substrate 300 to the redistribution structure 200 as illustrated in FIG. 23. The conductive connectors 365 may be first formed on either the core substrate 300, or the redistribution structure 200, and then reflowed to complete the bond. For example, in the embodiment shown in FIG. 23, conductive connectors 365 are formed on UBMs 330A of the bottom redistribution structure 340A with a pitch between 150 μm and 1000 μm. The conductive connectors 365 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 365 may include a conductive material such as solder, copper, aluminum, gold, nickel, silver, palladium, tin, the like, or a combination thereof. In some embodiments, the conductive connectors 365 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 365 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 23 core substrate 300 are bonded to the singulated redistribution structure 200. In some embodiments, the core substrate 300 may be placed on the redistribution structure 200 using a pick and place process or another suitable process and the conductive connectors 365 bonded by flip chip bonding process or other suitable bonding process. In some embodiments, the conductive connectors 365 are reflowed to attach the core substrate 300 to the redistribution structure 200 by way of metallization pattern 174. The conductive connectors 365 electrically and/or physically couple the core substrate 300 to the redistribution structure 200. In some embodiments, the conductive connectors 365 have a pitch in a range from 20 µm to 500 µm.

The conductive connectors 365 may have an epoxy flux (not shown) formed thereon before they are reflowed with at least some of the epoxy portion of the epoxy flux remaining after the core substrate 300 are attached to the redistribution structure 200.

In some embodiments, an underfill 370 is formed surrounding the conductive connectors 365 between the redistribution structure 200 and the core substrate 300. The underfill 370 may reduce stress and protect the joints resulting from the reflowing of the conductive connectors 365. The underfill 370 may be formed by a capillary flow process after the core substrate 300 is attached, or may be formed by a suitable deposition method. In some embodiments, a single layer of underfill 370 is formed, and further subsequent underfills (not shown) or encapsulants (not shown) may be formed on top of the core substrate 300.

External connectors 620, as shown in FIG. 1, are formed on the UBMs 330B of the core substrate 300. The external connectors 620 may be ball grid array (BGA) connectors, solder balls, metal pillars, controlled collapse chip connection (C4) bumps, micro bumps, or the like. The external connectors 620 may include a conductive material such as solder, copper, aluminum, gold, nickel, silver, palladium, tin, the like, or a combination thereof. In some embodiments, the external connectors 620 are formed by initially forming a layer of reflowable material on the UBMs 330B through evaporation, electroplating, printing, solder transfer, ball placement, or the like. Once a layer of reflowable material has been formed on the UBMs 330B a reflow may be performed in order to shape the material into the desired bump shapes.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. For example, the local interconnect components increase the communication bandwidth between the integrated circuit dies while maintaining low contact resistance and high reliability. Further, the redistribution structure, the embedded local interconnect component, the core substrate, and the integrated circuit dies, may be individually fabricated and tested prior to assembling the completed package component. This further increases component and board level reliability. Because of the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a core substrate;
   a redistribution structure coupled to a first side of the core substrate, the redistribution structure comprising:
      a plurality of redistribution layers, each of the plurality of redistribution layers comprising a dielectric layer and a metallization layer;
      a first local interconnect component embedded in a first redistribution layer of the plurality of redistribution layers, the first local interconnect component comprising a substrate, an interconnect structure on the substrate, and conductive connectors, the conductive connectors being bonded to a metallization layer of the first redistribution layer by first solder connections, the metallization layer of the first redistribution layer comprising first conductive lines and first conductive vias, the first local interconnect component further comprising a first through via extending through the substrate of the first local interconnect component, the first through via being electrically coupled to the interconnect structure of the first local interconnect component; and
      a first underfill in the first redistribution layer, the first underfill surrounding the first solder connections;
   a first integrated circuit die coupled to the redistribution structure, the redistribution structure being interposed between the core substrate and the first integrated circuit die;
   a second integrated circuit die coupled to the redistribution structure, the redistribution structure being interposed between the core substrate and the second integrated circuit die, the interconnect structure of the first local interconnect component electrically coupling the first integrated circuit die to the second integrated circuit die; and
   a set of conductive connectors coupled to a second side of the core substrate.

2. The structure of claim 1, wherein the redistribution structure is coupled to the first side of the core substrate using second solder connections.

3. The structure of claim 2 further comprising:
   a second underfill interposed between the redistribution structure and the core substrate and surrounding the second solder connections.

4. The structure of claim 3, wherein the second underfill extends along sidewalls of the redistribution structure.

5. The structure of claim 1, wherein the first underfill contacts the first conductive lines and a dielectric layer of the first redistribution layer.

6. The structure of claim 1, wherein the interconnect structure of the first local interconnect component is on a first side of the substrate of the first local interconnect component, the first side of the first local interconnect component facing the first integrated circuit die.

7. The structure of claim 6, wherein
the first through via is electrically coupled to a metallization layer of the plurality of redistribution layers on a second side of the substrate of the first local interconnect component, the second side being opposite the first side.

8. The structure of claim 1, wherein the substrate of the first local interconnect component is a silicon substrate.

9. A package comprising:
a first redistribution structure, the first redistribution structure comprising:
a plurality of redistribution layers, each of the plurality of redistribution layers comprising a metallization pattern and a dielectric layer, a first redistribution layer of the plurality of redistribution layers comprising:
a first dielectric layer;
a first metallization pattern;
a first interconnecting die, the first interconnecting die comprising a substrate, an interconnect structure on the substrate, and die connectors on the interconnect structure, the die connectors being bonded to a metallization pattern of the first redistribution layer by first solder bumps, the first metallization pattern comprising first conductive lines and first conductive vias, the first dielectric layer encapsulating the first interconnecting die; and
a first underfill between the first interconnecting die and the first metallization pattern, the first underfill surrounding and contacting the first solder bumps, the first dielectric layer encapsulating the first underfill;
a core substrate coupled to a first side of the first redistribution structure using a first set of conductive connectors, a width of the first redistribution structure being less than a width of the core substrate; and
an integrated circuit die package coupled to a second side of the first redistribution structure using a second set of conductive connectors, the second side being opposite the first side, wherein the first interconnecting die further comprises:
a first through via extending through the substrate of the first interconnecting die, the first through via being electrically coupled to the interconnect structure of the first interconnecting die and a metallization pattern of the plurality of redistribution layers an opposite side of the substrate of the first interconnecting die as the interconnect structure.

10. The package of claim 9, wherein the first set of conductive connectors and the second set of conductive connectors each comprise solder.

11. The package of claim 9, further comprising:
a second underfill interposed between the core substrate and the first redistribution structure and surrounding the first set of conductive connectors.

12. The package of claim 9, wherein the first redistribution structure further comprises a second redistribution layer, the second redistribution layer being between the first redistribution layer and the integrated circuit die package, the second redistribution layer comprising a second dielectric layer, the second dielectric layer being a different material than the first dielectric layer.

13. The package of claim 9, wherein the substrate of the first interconnecting die comprises a silicon substrate.

14. The package of claim 9, further comprising:
a second underfill between the first redistribution structure and the core substrate and surrounding the first set of conductive connectors.

15. The package of claim 14, wherein the second underfill extends along sidewalls of the first redistribution structure.

16. The package of claim 9, wherein the substrate of the first interconnecting die is a silicon substrate.

17. A structure comprising:
a first substrate;
a redistribution structure bonded to a first side of the first substrate by first solder connections, the redistribution structure comprising:
a plurality of redistribution layers, each of the plurality of redistribution layers comprising a dielectric layer and a metallization layer;
a first local interconnect component embedded in a first redistribution layer of the plurality of redistribution layers, the first local interconnect component comprising a second substrate, an interconnect structure, and conductive connectors, the conductive connectors being bonded to a metallization layer of the first redistribution layer by second solder connections; and
a first underfill in the first redistribution layer, the first underfill surrounding and contacting the second solder connections, a first dielectric layer of the first redistribution layer surrounding and contacting the first underfill;
a first die bonded to the redistribution structure; and
a second die bonded to the redistribution structure, the interconnect structure of the first local interconnect component electrically coupling the first die to the second die, wherein the first local interconnect component further comprises:
a first through via extending through the second substrate of the first local interconnect component, the first through via being electrically coupled to the interconnect structure of the first local interconnect component and a metallization layer of the plurality of redistribution layers on a side of the second substrate opposite the interconnect structure of the first local interconnect component.

18. The structure of claim 17 further comprising:
a second underfill between the redistribution structure and the first substrate and surrounding the first solder connections.

19. The structure of claim 17, wherein the first underfill contacts the metallization layer of the first redistribution layer.

20. The structure of claim 17, wherein the first die comprises a logic die, and wherein the second die comprises a memory die.

* * * * *